United States Patent
Sato

(10) Patent No.: US 6,593,211 B2
(45) Date of Patent: *Jul. 15, 2003

(54) SEMICONDUCTOR SUBSTRATE AND METHOD FOR PRODUCING THE SAME

(75) Inventor: Nobuhiko Sato, Sagamihara (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/390,283

(22) Filed: Sep. 3, 1999

(65) Prior Publication Data

US 2002/0127820 A1 Sep. 12, 2002

(30) Foreign Application Priority Data

Sep. 4, 1998 (JP) .......................... 10-251270

(51) Int. Cl.⁷ .............................. H01L 21/30
(52) U.S. Cl. ...................... 438/455; 438/149; 438/155; 257/758
(58) Field of Search ................. 438/455, 456, 438/457, 458, 459, 460, 149, 150, 151, 152, 153, 154, 155, 139; 257/758

(56) References Cited

U.S. PATENT DOCUMENTS

| 5,102,819 | A | * | 4/1992 | Matsushita et al. ......... 438/245 |
| 6,121,117 | A | * | 9/2000 | Sato et al. .................. 438/459 |
| 6,136,684 | A | * | 10/2000 | Sato et al. .................. 438/624 |
| 6,143,628 | A | * | 11/2000 | Sato et al. .................. 438/455 |
| 6,143,629 | A | * | 11/2000 | Sato ........................... 438/455 |

FOREIGN PATENT DOCUMENTS

| JP | 5-21338 | | 1/1993 | |
| JP | 9-100197 | | 4/1997 | |
| JP | 409100197 A | * | 4/1997 | ........... C30B/29/06 |
| KR | 97-8331 | | 2/1997 | |

OTHER PUBLICATIONS

U.S. patent application Publication US 2002/0070291 A1; Yamagita et al.*

N. Sato, et al., "Hydrogen Annealed Silicon–on–Insulator", Appl. Phys. Lett., vol. 65, No. 15, pp. 1924–1926 (1994).

T. Yonehara, et al., "Epitaxial Layer Transfer by Bond and Etch Back of Porous Si", Appl. Phys. Lett., vol. 64, No. 16, pp. 2108–2110 (1994).

K. Imai, "A New Dielectric Isolation Method Using Porous Silicon", Solid State Elec., vol. 24, No. 2, pp. 159–164 (1981).

J. B. Lasky, et al., "Silicon–on–Insulator (SOI) by Bonding and Etch–Back", Int'l. Elec. Devices Meeting, Washington DC, pp. 684–687 (1985).

G. Ghidini, et al., "Interaction of $H_2O$ with Si(111) and (100)", J. Electrochem. Soc., vol. 131, No. 12, pp. 2924–2928 (1984).

F.W. Smith, et al., "Reaction of Oxygen with Si(111) and (100): Critical Conditions for the Growth of $SiO_2$", J. Electrochem. Soc., vol. 129, No. 6, pp. 1300–1306 (1982).

N. Sato, et al. "Epitaxial Growth On Porous Si For A New Bond And Etch–Back Soi", Proceedings of the Seventh International Symposium on Silicon Materials Science and Technology, Semiconductor Silicon, pp. 443–453 (1994).

N. Sato, et al., "Advanced Quality in Epitaxial Layer Transfer by Band and Etch–back of Porous Si", Jpn. J. Appl. Phys., vol. 35, p. 973 (1996).

* cited by examiner

Primary Examiner—Olik Chaudhuri
Assistant Examiner—Fernando Toledo
(74) Attorney, Agent, or Firm—Fitzpatrick, Cella, Harper & Scinto

(57) ABSTRACT

There are disclosed a semiconductor substrate having a non-porous monocrystalline layer with reduced crystal defects on a porous silicon layer and a method of forming the substrate.

The forming method comprises a heat treatment step of heat-treating a porous silicon layer in an atmosphere not containing a silicon-based gas and the step of growing a non-porous monocrystalline layer on the porous silicon layer, wherein the heat treatment is conducted under the conditions such that the etched thickness of the silicon layer is 2 nm or less and that the rate of change r of the surface pore density of the porous silicon layer (r=surface pore density after heat treatment/surface pore density before heat treatment) satisfies the relationship $1/10000 \leq r \leq 1$.

30 Claims, 10 Drawing Sheets

FIG. 10A
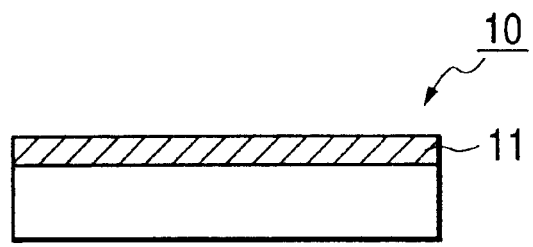
FIG. 10B
FIG. 10C
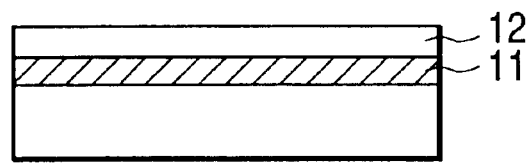
FIG. 10D
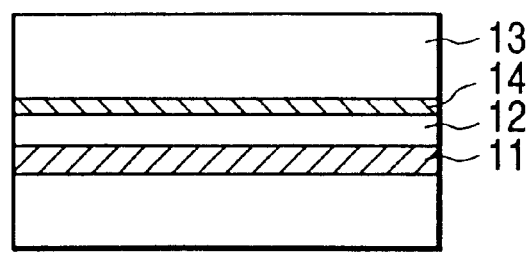
FIG. 10E
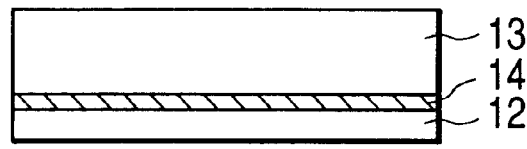

SEMICONDUCTOR SUBSTRATE AND METHOD FOR PRODUCING THE SAME

BACKGROUND OF THE INVENTION

1. Field of the Invention

The present invention relates in general to a semiconductor substrate and a method for producing the same and, more particularly to, a non-porous semiconductor layer formed on a porous semiconductor layer and a method for forming the same.

The present invention relates also to a semiconductor substrate utilized as a base member for integrated circuits using mainly MOSFETs and bipolar-transistors and a method for forming the same.

2. Related Background Art

Various researches have been conducted in the integrated-circuit (IC) technologies for silicon-based semiconductor devices to work out a silicon-on-insulator (SOI) structure, in which a monocrystalline silicon film is disposed on an insulator, because the structure reduces parasitic capacitance and facilitates element isolation, thus improving the operation speed of transistor, decreasing the power consumption, improving the integration density, and reducing the total cost.

To form the SOI structure there has been available the Fully Isolation by Porous Silicon (FIPOS) method proposed by Imai in the 1970s through the early 1980s (K. Imai, Solid State Electronics 24 (1981), p. 159). The FIPOS method utilizes the accelerated oxidation phenomenon of porous silicon to form an SOI structure but has a problem that it can inherently form a surface silicon layer only in the shape of islands.

One of the SOI formation technologies attracting the world attention in recent years is the wafer bonding technology, surrounding which have been proposed various methods because the SOI structure provides arbitrariness in the thickness of a surface silicon layer and a buried silicon oxide layer as well as good crystallinity of the surface silicon layer.

Although the bonding method, by which wafers are bonded without an adhesive agent or any other intermediate layers, was proposed originally by Nakamura et al., its research has come to be made greatly since 1984, when J. B. Lasky et al. reported the method of thinning one of two bonded wafers and the operation of a MOS transistor formed thereon (J. B. Lasky, S. R. Stiffler, F. R. White, and J. R. Abernathey, Technical Digest of the International Electron Devices Meeting (IEEE, New York, 1985), p. 684).

By the method by Lasky et al., a first wafer which is a monocrystalline silicon wafer incorporated with boron at a high concentration and having formed thereon a low-concentration or n-type epitaxial silicon layer and a second wafer having an oxide film formed on a surface thereof are provided and rinsed, as necessary, and are then brought into close contact with each other, so that the two wafers are bonded to each other by the van der Waals force. The two wafers undergo heat treatment to form covalent bonds therebetween, whereby the bonding strength is enhanced to such a level as not to disturb the production of devices. Then, the first wafer is etched on its back side with a mixture liquid of hydrofluoric acid, nitric acid, and acetic acid, to selectively remove the $p^+$ silicon wafer so that only the epitaxial silicon layer remains on the second wafer, which is called also the single etch-stop method. However, the ratio of the etch rate for the $p^+$ silicon to that for the epitaxial silicon ($p^-$ or n type) is as low as several 10s, thus requiring further improvements to leave a uniform thickness of an epitaxial silicon layer on the entire wafer surface.

Thus, a method has been worked out for conducting selective etching twice. That is, as a first substrate is provided a low-impurity-concentration silicon wafer substrate on a surface of which are stacked a $p^{++}$ type Si layer and a low-impurity-concentration layer; then this first wafer is bonded to such a second wafer as described above. Then, the first substrate is thinned by grinding, polishing, or any other mechanical method on its back side. Next, the first substrate undergoes selective etching until the whole surface of the $p^{++}$ Si layer buried in the first substrate is exposed. In this case, selective etching due to the difference in the impurity concentration of the substrate is effected by using an alkaline liquid such as ethylene diamine pyrocatechol, KOH, etc. Then, the exposed $p^{++}$ Si layer is selectively removed by the selective etching by use of a mixture liquid of hydrofluoric acid, nitric acid, and acetic acid as is the case with the above-mentioned Lasky method, so that only the above-mentioned low-impurity-concentration monocrystalline Si layer is transferred onto the second substrate, which is called the double etch-stop method. This method, by carrying out selective etching a plurality of times, has proved to improve the overall etch selectivity, resulting in a better uniformity in the thickness of the surface Si layer in the SOI.

However, it may be anticipated that the thinning of layers by means of selective etching utilizing the above-mentioned difference in the impurity concentration or composition of the substrate would be affected by the depth profile of the impurity concentration. That is, if the wafers, after the bonding, are heat-treated at a high temperature in order to enhance the bonding strength, the impurity in the buried layer diffuses, so that the etch selectively degrades, resulting in lowering in the uniformity of film thickness. Therefore, the heat treatment after bonding had to be carried out at 800° C. or less. Moreover, because each of the plural times etching would provide a low etch selectivity, the controllability at the time of mass-production was worried about.

In contract to the above-mentioned method, in which etch selectivity depends on a difference in impurity concentration or composition, Japanese Patent Application Laid-Open No. 5-21338 employs a difference in structure to provide etch selectivity. That is, this method implements an etch selectivity as high as 100,000 due to structural difference between porous silicon with a surface area per unit volume such as 200 $m^2/cm^3$ and non-porous silicon, which is called a selective etching method utilizing a structural difference using porous silicon. By this method, a surface of a monocrystalline Si wafer given for a first substrate is anodized to make porous, after which a non-porous monocrystalline silicon layer is epitaxially grown thereon to provide the first substrate. Then, it is bonded to a second substrate and undergoes heat treatment as necessary to enhance the bonding strength. Subsequently grinding, polishing or the like is carried out to remove the back side of the first substrate, thus exposing the porous silicon layer in its whole surface. Next, the porous silicon is selectively removed by etching to, with the result that the above-mentioned non-porous monocrystalline silicon layer is transferred onto the second substrate. Since a high etch selectivity as much as 100,000 was obtained, the uniformity in the thickness of the SOI layers obtained was impaired little by the etching, reflecting the uniformity of the monocrystalline silicon layer during the epitaxial growth as such. That is, as is the case with a commercially available CVD epitaxial growth apparatus, this method attains an in-wafer uniformity, for example 1.5% to 3% or less, for the SOI-Si layer. This method uses, as the material for selective etching, the porous silicon which is used as the material for selective oxidation in the FIPOS method. Therefore, this method does not limit the porosity to about 56% but prefers a rather low value of about 20%. Note here that the method for producing SOI structures disclosed in the above-mentioned Japanese Patent Application Laid-Open No. 5-21338 was named ELTRAN (trademark) in a report by Yonehara et al. (T. Yonehara, K. Sakaguchi, N. Sato, Appl. Phys. Lett. 64 (1994), p. 2108).

Also, since porous silicon will not become the structural member of a final product, the structural change and the coarsening of porous silicon are tolerated as far as they will not impair the etch selectivity.

Sato et al., the inventor of the present invention, conducted a Chemical Vapor Deposition (CVD) method using a $SiH_2Cl_2$ gas as the source gas for the epitaxial growth on a porous substance at process temperatures of 1040° C. for heat treatment before epitaxial growth and 900 to 950° C. during epitaxial growth (N. Sato, K. Sakaguchi, K. Yamagata, Y. Fujiyama, and T. Yonehara, Proc. of the Seventh Int. Symp. on Silicon Mater. Sci. and Tech., Semiconductor Silicon, (Pennington, The Electrochem. Soc. Inc., 1994), p. 443).

To avoid remarkable structural coarsening of porous silicon during heat treatment at a high temperature, Sato et al. introduced, prior to the epitaxial growth step, a preoxidation step of forming a protective film at the walls of porous silicon pores to almost suppress the structural coarsening of the porous silicon layer involved in the heat treatment. The preoxidation is carried out, for example, at 400° C. in oxygen atmosphere.

A key factor to this method is how to reduce the defects formed during the epitaxial growth of non-porous monocrystalline silicon on porous silicon. Thus made SOI wafers have stacking faults as the main defect and, reportedly, has a stacking fault density of $10^3$ to $10^4/cm^2$ in an epitaxial silicon layer on porous silicon.

It is generally pointed out that stacking faults may degrade the dielectric strength of oxide films. This is considered because when a metal impurity precipitates at a dislocation portion surrounding a stacking fault, a leakage current of a p-n junction would increase, thereby degrading the lifetime of minority carriers. The other reports on the epitaxial growth on a porous substance did not refer to a crystal defect density of less than $10^3/cm^2$ by means of observation with an optical microscope after defect revealing etching with a lower detection limit. Although the probability of stacking faults of $10^3$ to $10^4/cm^2$ being lying in a gate region of 1 $\mu m^2$ is as low as 0.0001 to 0.00001, as compared to a bulk silicon wafer, the defect density is till high and so expected to be revealed as decreases in the yield of IC production. For practical application of SOI wafers obtained by the above-mentioned method, it is necessary to reduce the stacking fault density to at least $1000/cm^2$.

SUMMARY OF THE INVENTION

A semiconductor substrate having a non-porous monocrystalline layer with decreased crystal defects on a porous silicon layer is provided. A method for producing the substrate is also disclosed.

A substrate having a non-porous monocrystalline layer with a lower crystal defect density on an insulator is also provided. A method for producing the substrate is also disclosed.

According to a first aspect of the present invention, a semiconductor substrate is produced by providing a porous silicon layer substrate, heat-treating the porous silicon layer, and growing a non-porous monocrystalline layer on the porous silicon layer. The heat treatment step is conducted in an atmosphere which does not contain a source gas of the non-porous monocrystalline layer. The thickness of a portion of the silicon which has been removed by etching (hereinafter referred to as "etched thickness") due to the heat treatment is not more than 2 nm. Further, the rate of change r for the surface pore density of the porous silicon layer, defined as (the surface pore density after the heat treatment)/(the surface pore density before the heat treatment), satisfies the relationship of $(1/10000) \leq r \leq 1$.

According to a second aspect of the present invention, a semiconductor substrate is produced by providing a first substrate comprising a porous silicon layer, heat-treating the porous silicon layer, growing a non-porous monocrystalline layer on the porous silicon layer, and transferring the non-porous monocrystalline layer grown on the first substrate onto a second substrate. The heat treatment step is conducted in an atmosphere which does not contain a source gas of the non-porous monocrystalline layer. The etched thickness of silicon due to the heat treatment is not more than 2 nm, and the rate of change r for the surface pore density of the porous silicon layer defined above satisfies the relationship of $(1/10000) \leq r \leq 1$.

The present invention also includes embodiments wherein the rate of change r satisfies the relationship of $(1/100) \leq r \leq 1$.

Moreover, heat treatment in the present invention may comprise removing an oxide on a surface of the porous silicon layer.

BRIEF DESCRIPTION OF DRAWINGS

FIGS. 10A, 10B, 10C, 10D and 10E are schematic views illustrating the steps for producing an SOI substrate according to the present invention;

DESCRIPTION OF THE PREFERRED EMBODIMENTS

Figure 1:
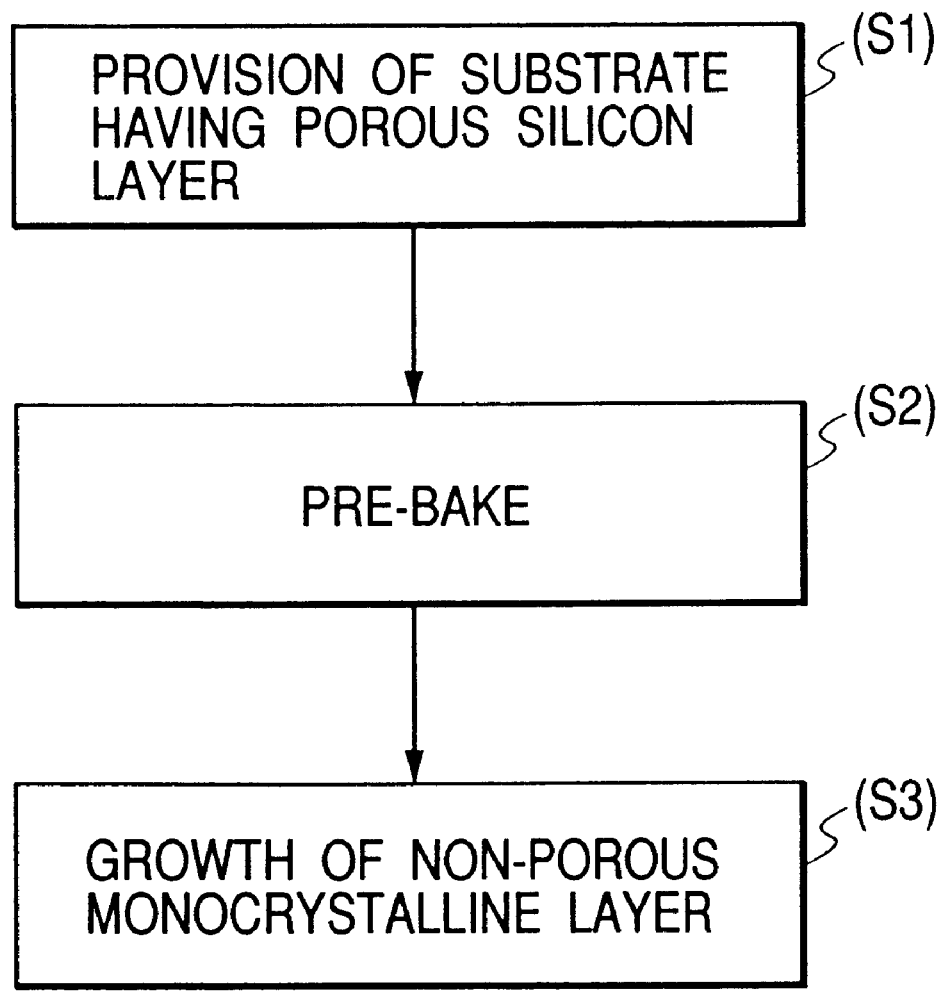
FIG. 1 is a flowchart illustrating a step of growing a non-porous monocrystalline layer on a porous silicon layer.

First, a method is explained for forming a nonporous monocrystalline layer (epitaxial growth layer) on a porous silicon layer with reference to the flowchart of FIG. 1.

First, a substrate is provided which has a porous silicon layer (S1). Next, prior to the growth of a non-porous monocrystalline layer, the porous silicon layer is heat-treated in an atmosphere not containing a source gas of the non-porous monocrystalline layers.

This heat treatment is called a pre-bake step (S2), by which a native oxide film formed on the surface of the porous silicon layer are, for example, removed.

Note here that the above-mentioned heat treatment "in an atmosphere not containing a source gas of a non-porous monocrystalline layer" refers specifically to that in a reducing atmosphere containing hydrogen gas, an atmosphere of an inert gas such as He, Ar, Ne, etc., or ultra-high vacuum.

After the above-mentioned pre-bake step, a source gas is introduced to grow a non-porous monocrystalline layer (S3). Thus, the non-porous monocrystalline layer is grown on the porous silicon layer.

Next, the technical findings which led to the present invention are described below.

(Experiment 1)

The present inventor observed how the pore density at a surface of a porous silicon layer changed after the pre-bake step in order to check in detail how the pre-bake step had affected stacking faults introduced into the monocrystalline silicon on the porous silicon layer.

Note here that the inventor took care not to allow water or oxygen to enter an apparatus employed for the pre-bake step, in order to minimize their influence on the pore diameter and the pore density during the pre-bake step.

Specifically, as detailed below, a load-lock chamber is provided to allow taking in and out of wafers without directly exposing a reaction chamber to the atmosphere.

The leakage amount from the reaction chamber is preferably 20 mTorr/min or less, more preferably 10 mTorr/min or less.

Also, the leakage amount from a gas panel of the gas supply system is preferably 0.5 psi/24 h, more preferably 0.2 psi/24 h.

Also again, as the supply gas, a highly purified gas is preferable. Specifically, when, for example, $H_2$ gas is used to carry out the pre-bake step, it is preferable to use $H_2$ gas that passed through a gas purifier located within about 20 meters, preferably about 10 meters from the apparatus. As the purifier, there are preferably used one the type for passing the gas through heated palladium diffusion cells or the filter type one having an adsorbent.

Figure 2:
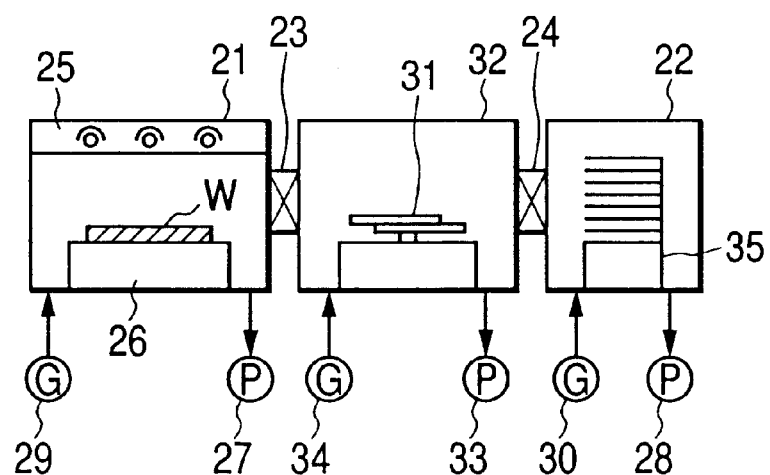
FIG. 2 is a schematic view illustrating an example of an epitaxial growth apparatus with a load-lock chamber.

FIG. 2 shows a schematic view of the treatment apparatus, in which reference numeral 21 denotes a reaction chamber (process chamber), reference numeral 22 denotes a load-lock chamber, reference numeral 32 denotes a carrier chamber (transport chamber), a reference numeral 23 denotes a gate valve which provides a partition between the reaction chamber 21 and the carrier chamber 32, and reference numeral 24 denotes a gate valve which provides a partition between the carrier chamber 32 and the load-lock chamber 22. Reference numeral 25 denotes a heater such as a lamp for heating substrate W, reference numeral 26 denotes a susceptor for holding the substrates W thereon, reference numerals 27, 28, and 33 denote exhaust systems for exhausting respectively the reaction chamber 21, the load-lock chamber 22, and the carrier chamber 32, reference numeral 29 denotes a gas supply system for introducing a processing gas into the reaction chamber 21, and reference numerals 30 and 34 denote gas supply systems for introducing a gas respectively into the carrier chamber 32 and the load-lock chamber 22 to purge or pressure-increase the inside thereof. Reference numeral 31 denotes a carrier arm for carrying the substrate W in or out of the reaction chamber 21. Reference numeral 35 denotes a wafer cassette. Further, there can be used such a modification that the load-lock chamber 22 is integrated with the carrier chamber 32 for housing the carrier arm, instead of separating it from the carrier chamber 32 with the gate valve 24.

Note here that heat treatment conducted using such a treating apparatus equipped with a load-lock chamber is referred to as "heat treatment in system A" for convenience.

In the system A, the heater of the reaction chamber can be energized beforehand to pre-heat the susceptor, etc. to 600 to 1000° C.

By using this method, it is possible to increase the temperature of a wafer put into the reaction chamber up to 600 to 1000° C. in about 10 seconds, thus enabling to reduce the temperature up time and also to suppress the progressing of change in pore state at the porous silicon surface due to this heat treatment.

After a substrate on which a porous silicon layer was formed was subjected to only heat treatment (pre-bake-step) using the apparatus equipped with a load-lock chamber, it was taken out from the reaction chamber and observed by a high resolution scanning electron microscope (HR-SEM).

Figure 3A:
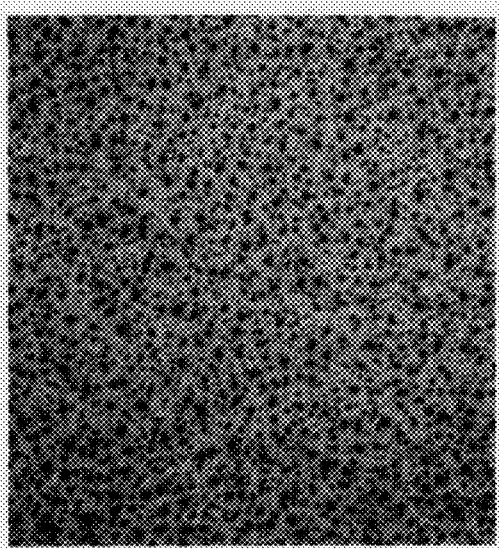
FIGS. 3A, 3B and 3C are SEM photographs of surface pores of a porous member.

The porous silicon was produced by anodization in an $HF-C_2H_5OH-H_2O$ mixed solution and then heat-treated at 400° C. in an oxygen atmosphere for 1 hour (pre-oxidation step). Then, it was dipped in a 1.25% HF aqueous solution for 25 seconds (HF dip step), rinsed, dried, and then placed in an epitaxial growth apparatus. FIG. 3A shows a SEM image of a porous silicon layer surface immediately before it is placed in the epitaxial growth apparatus. Pores with an approximately 10 nm diameter were observed to have been formed at a density of $10^{11}/cm^2$.

Figure 3B:
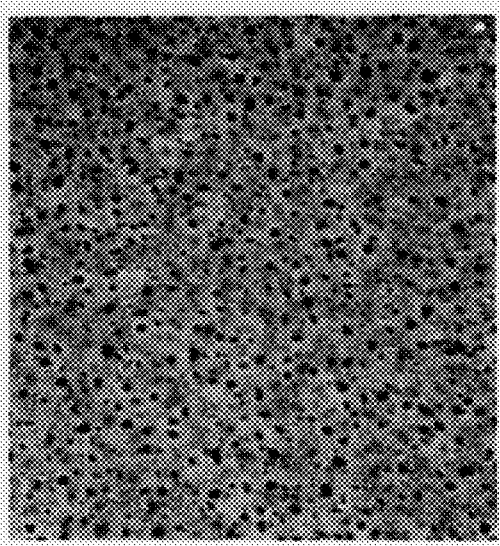

FIG. 3B shows a SEM image of a porous silicon layer surface immediately after it underwent heat treatment in hydrogen at 950° C. at 600 Torr for as long as 2 seconds. The pore density was somewhat decreased but still in an order of $10^{10}/cm^2$. The pore diameter was almost unchanged, being 10 nm or so.

Figure 3C:
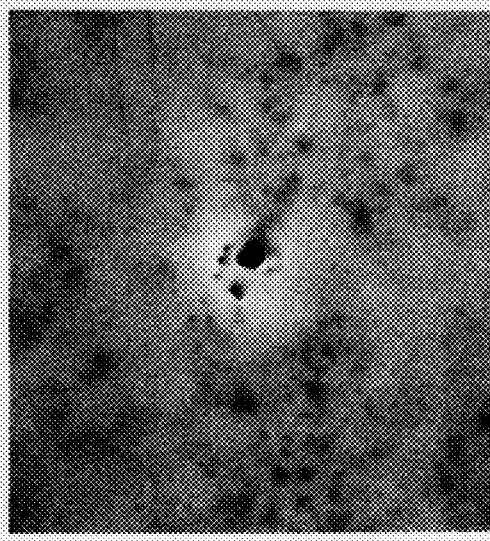

Another porous silicon layer surface treated in hydrogen at 1100° C. for as long as 2 seconds, on the other hand, was observed to have been decreased remarkably in pore density down to about $10^6/cm^2$. The residual pores, as shown in FIG. 3C, were increased in diameter with some of them reaching 40 nm. Those increases in pore diameter are considered to be due to enlargement by oxidation with residual oxygen and water, etching, or surface diffusion, or coalescence of adjacent pores, etc.

In the case of FIG. 3B, the density of stacking faults introduced into the non-porous monocrystalline silicon on the porous silicon layer was $1 \times 10^2/cm^2$, while in the case of FIG. 3C, it was $2 \times 10^4/cm^2$.

As for the pre-bake step, as disclosed for example in Japanese Patent Application Laid-Open No. 9-100197, it was considered that pores were blocked due to migration of Si atoms, which led to decreases in the stacking fault density.

Although it depends on other parameters such as pre-bake temperature, time, and the environment in the concerned apparatus for pre-bake, this experiment showed that pores were blocked, while at the same time, residual pores with large pore diameters were generated, though being small in number. It was found that the pre-bake step decreases the pore density but increases the stacking fault density such as shown in FIG. 3C.

As for this pre-bake step, as disclosed for example in Japanese Patent Application Laid-Open No. 9-100197, it was found that pores are blocked due to migration of Si atoms, leading to decreases in the stacking fault density.

However, N. Sato et al. suggested in Jpn. J. Appl. Phys. 35 973 (1996) that although most of the pores of the whole surface are sealed by the pre-bake step, residual pores, though being small in number, are present, which causes introduction of stacking faults.

For example, the reduction of a surface pore density of $10^{11}/cm^2$ to $10^4/cm^2$ means that 99.99999% of the surface pores are sealed, while pores remain at a density of $10^4/cm^2$.

This experiment showed that the stacking fault density is larger in the case of FIG. 3C with a larger decrease in the pore density due to the pre-bake step than in the case of FIG. 3B with a smaller decrease in the pore density.

This means that the pre-bake step decreases the pore density on the porous silicon layer surface near a non-porous surface, while at the same time, the diameters of the residual pores increases, with the result that decreasing the stacking fault density cannot be expected.

Figure 4A:
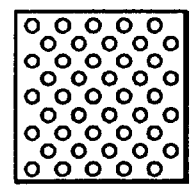
FIGS. 4A, 4B and 4C are schematic views showing the state of surface pores of a porous member.
Figure 4B:
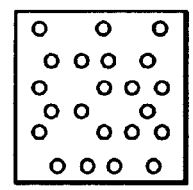
Figure 4C:
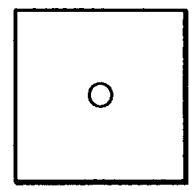
Figure 5:
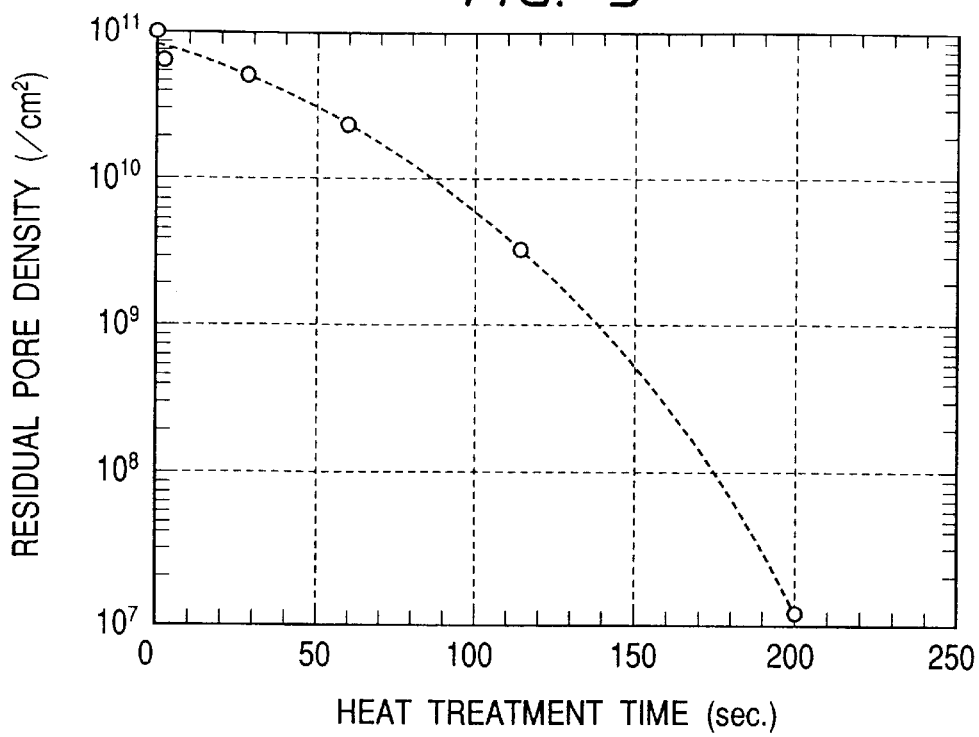
FIG. 5 is a graph explaining a relationship between heat treatment time and residual surface pore density.

That is, it was found that the pre-bake step decreases the pore density of the porous surface and, at the same time, increases the diameters of some pores. FIGS. 4A, 4B, and 4C are schematic representations of SEM images of FIGS. 3A, 3B, and 3C, respectively. Also, FIG. 5 shows the relationship between the residual pore density of the porous silicon layer surface and the heat treatment time obtained in the experiment using the above-mentioned apparatus with a load-lock chamber. As the heat treatment conditions, the temperature was 950° C., the pressure was 600 Torr, and a hydrogen gas atmosphere was employed.

It is found that as the heat treatment time passes by, the residual pore density gradually decreases and, in 200 seconds, the pore density at the porous surface becomes about $10^7/cm^2$ as compared to $10^{11}/cm^2$ before the heat treatment. Of course, when the pore density became $10^7/cm^2$, residual pores with large diameters were generated though being small in number.

(Experiment 2)

The present inventor further checked the correlation between the residual pore density and the stacking fault density after the pre-bake step. The results are shown in FIG. 6.

The pre-bake step was carried out using the above-mentioned apparatus with a load-lock chamber in order to avoid the influence by water and oxygen present in the apparatus used for this step. That is, this is a heat treatment in system A.

Figure 6:
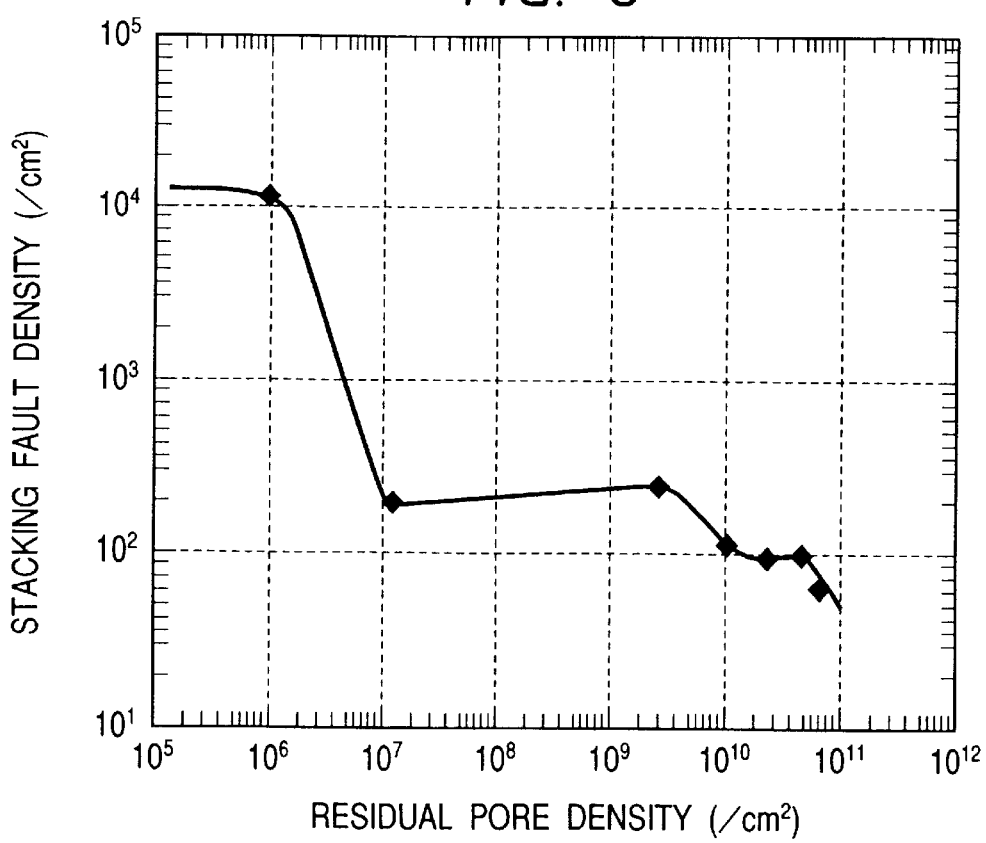
FIG. 6 is a graph explaining a relationship between residual pore density and stacking fault density.

With the pore density of the porous silicon layer surface being about $10^{11}/cm^2$, it was found from FIG. 6 that when the residual pore density after the pre-bake step is $10^7/cm^2$ or more, the stacking fault density can be decreased drastically. That is, the stacking fault density can be decreased when the rate of change r (r=(residual pore density after pre-bake step)/(residual pore density before pre-bake step)) of the residual pore density between before and after the pre-bake step is $1/10000 \leq r \leq 1$, preferably $1/100 \leq r \leq 1$. Particularly, when $1/100 \leq r \leq 1$, the stacking fault density can remarkably be decreased.

Note here that, the stacking fault density can be obtained by defect revealing etching followed by observation by a microscope. Specifically, using as an etchant an aqueous solution of 2:1 mixture of $K_2Cr_2O_7$ (0.15 M) and 49% HF, which is generally used in the Secco etching, diluted with pure water so as to decrease the etch rate, the crystal defects introduced into the non-porous monocrystalline silicon layer of the wafer surface were revealed and then observed with a Nomarski differential interference microscope to determine the stacking fault density.

It was found that a large change in the pore density of the porous silicon layer surface after the pre-bake step has an influence on the stacking fault density of the non-porous monocrystalline silicon layer on a porous silicon layer.

Especially, it was found that when a silicon source gas is introduced and the deposition of non-porous monocrystalline silicon is started before the surface pores are deformed by the surface diffusion of silicon and the pore density is therefore drastically decreased; the stacking faults are decreased.

That is, the present inventor has first found that by controlling the decrease in pore density involved in the pre-bake step within less than 4 digits, preferably 2 digits or less, the crystalline defect density can be decreased down to about $10^2/cm^2$.

Incidentally, as a result of the heat treatment (pre-bake step), a tensile stress is applied in the porous silicon layer and therefore the lattice constant becomes larger than that of the monocrystalline silicon. With this, at the periphery of the residual pores of the porous silicon layer surface, this tensile stress is concentrated to make the lattice constant even larger, so that crystal defects are more prone to be introduced due to lattice mismatching.

The average inter-pore distance of the porous silicon surface is about 30 nm when the pore density is $10^{11}/cm^2$. This distance is not so large as compared to the pore size of 10–20 nm, a plurality of pores affects each other, so that the stress concentration at the periphery of the pores is relaxed. The average interpore distance is 100 nm at a pore density of $10^{10}/cm^2$ and is 300 nm at a pore density of $10^9/cm^2$. It is considered that these distances are sufficiently large as compared to the pore diameter, so that the relaxation effect of the stress concentration at the periphery of the pores due to inter-pore affection is almost eliminated, thus resulting in easy introduction of crystal defects at the portions of residual pores.

(Experiment 3)

Figure 7:
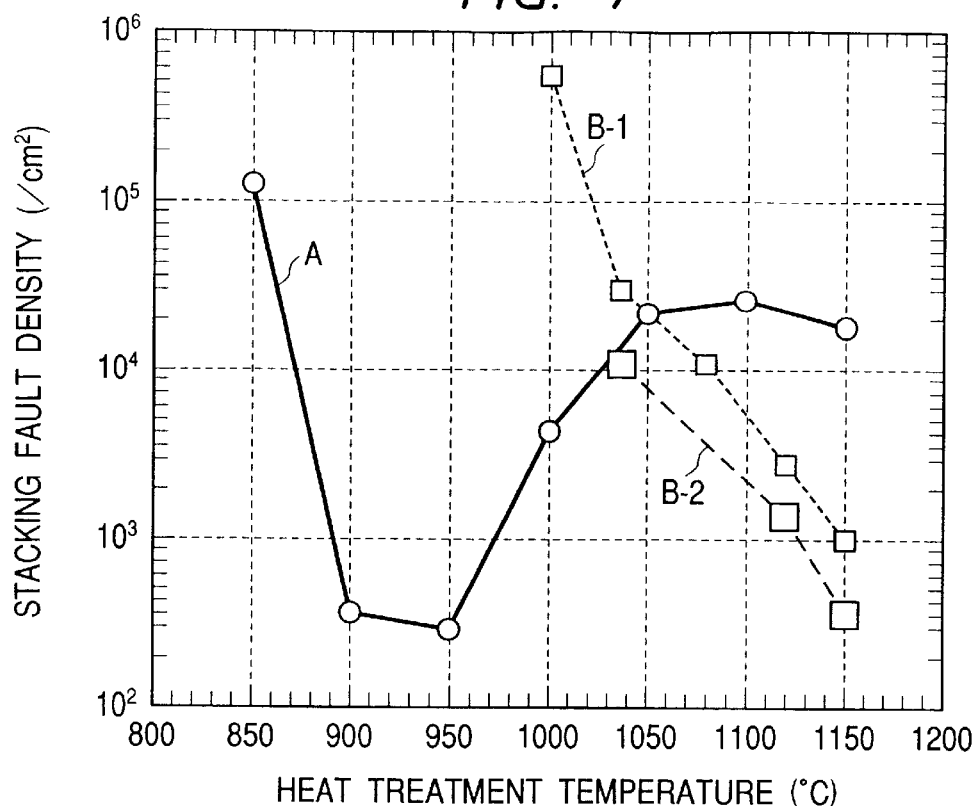
FIG. 7 is a graph explaining a relationship between heat treatment temperature and stacking fault density.

The present inventor further checked the correlation between the stacking fault density and the pre-bake temperature. The results are shown in FIG. 7. In FIG. 7, "A" represents data for the pre-bake step conducted in system A. The pressure at that time was 600 Torr. The data of "B-1" and "B-2" are described later.

The stacking fault density was in the order of $10^4/cm^2$ at high temperatures in excess of 1000° C. It was found that as the temperature decreased, however, minimal values of the stacking fault density appeared at around 950° C. with the density being decreased to about $10^2/cm^2$. That is, the pre-bake temperature is preferably not more than 1000° C., specifically not less than 880° C. and not more than 1000° C., more preferably not less than 870° C. and not more than 970° C., even more preferably not less than 900° C. and not more than 950° C.

Note here that the correlation between the pre-bake temperature and the stacking fault density is not always such as shown by "A" in FIG. 7. A similar experiment conducted at a pressure of 760 Torr by use of an apparatus, in contrast to system A, with an open type reaction chamber not equipped with a load-lock chamber (heat treatment conducted using this apparatus is hereinafter referred to as "heat treatment in system B") showed that as the pre-bake temperature rises, the stacking fault density is reduced (system B-1). Note here that in system B-2 the supply rate of a silicon source gas is decreased at the initial stage of growth to remarkably suppress the growth rate. As compared to system B-1, in system B-2 the stacking fault density is decreased to about 1/3 regardless of the temperature but, like in system B-1, the stacking fault density can be reduced only after the heat treatment temperature is increased. For system B, see a report by Sato et al. (N. Sato et al., Jpn. J. Appl. Phys. 35 (1996) 973).

The reason why the stacking fault density can be reduced at higher heat treatment temperatures is as follows. In systems B-1 and B-2, oxygen and water are present much in the apparatus, therefore, as the temperature rises, a silicon oxide is formed once on the surface of silicon by the residual oxygen and water.

At lower temperatures (1050° C. or lower), thus formed silicon oxide cannot completely be removed, so that the fault density is high. However, at sufficiently high temperatures and for a sufficiently long lapse of time reserved, the silicon oxide thus formed can be removed completely and the crystal defect density consequently starts to decrease.

It was found from the above that the correlation between the pre-bake temperature and the stacking fault density changes depending upon pre-bake environments such as oxygen and water amounts.

(Experiment 4)

Figure 8:
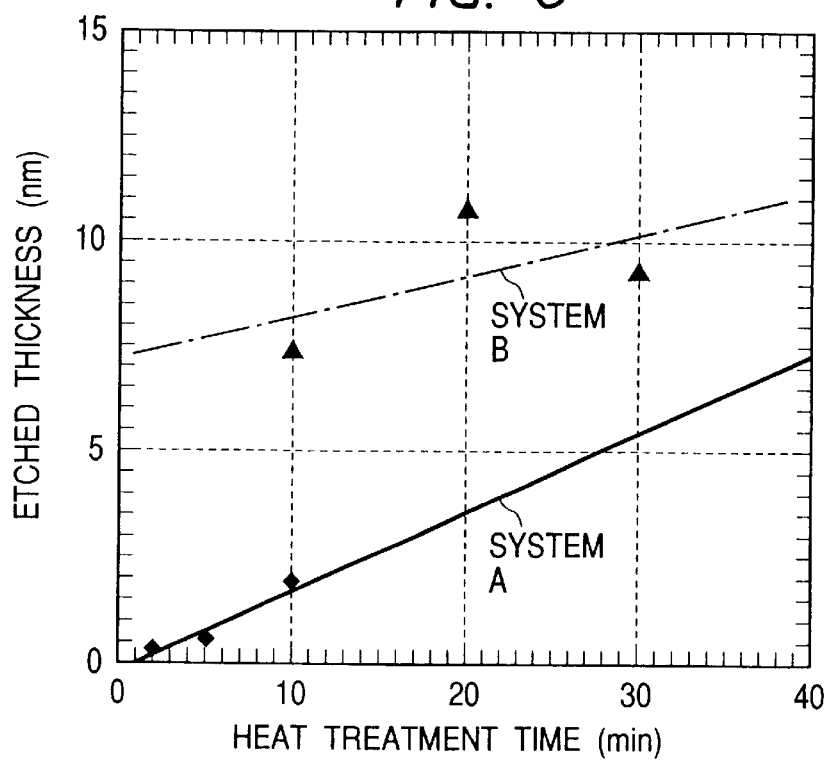
FIG. 8 is a graph explaining a relationship between heat treatment time and etched thickness.

The inventor checked how much silicon is etched during the heat treatment (pre-bake step), in order to determine the differences in amount of oxygen, water, etc. present in the reaction chamber in each of systems A and B. The results are shown in FIG. 8.

It is reported in F. W. Smith et al., J. Electrochem. Soc. 129, 1300 (1982) and G. Ghidini et al., J. Electrochem. Soc. 131, 2924 (1984) that when a slight amount of oxygen or water is present in a system, and when the concentration thereof is low, silicon is etched.

When the concentration of water, etc. is high, on the other hand, silicon is oxidized to form a silicon oxide. The thus formed silicon oxide reacts with adjacent silicon as the temperature rises, thereby being etched. That is, the following reaction takes place.

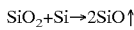

$SiO_2 + Si \rightarrow 2SiO\uparrow$

After all, oxygen or water remaining in the system contributes to the etching of silicon during temperature rise, so that the amount of residual oxygen and water in the reaction chamber can be estimated by checking the amount of silicon etched.

FIG. 8 shows the time-dependency of the amount of decrease in thickness due to etching of non-porous monocrystalline silicon in each of two systems A and B. In system A, the heat treatment was conducted at 1100° C. and at 600 Torr, while in system B, it was conducted at 1050° C. and at 760 Torr, and the heat-treating atmosphere was hydrogen for both systems. The etched thickness was determined by using an SOI substrate and measuring an amount of decrease in thickness of the SOI layer, i.e. the monocrystalline silicon layer. Note here that the reason why the temperature and the pressure are somewhat different between systems A and B is that the optimal conditions are different between the respective apparatuses.

In system B, even with the heat treatment time (y-intercept in the graph) being zero, the etched thickness is as much as 7 nm or more. This refers to the etched thickness when the substrate to be treated was heated to the set temperature and then cooled immediately. This means that only with a temperature rise, the silicon film thickness decreased by as much as about 7 nm. In system A, on the other hand, even with 10 minutes of heat treatment, the etched thickness is less than 2 nm.

Incidentally, it is known that in system A, the etched thickness with the lapse of the heat treatment time is larger at 1100° C. than at 1050° C. of the set temperature.

Thus, the difference in the amount of oxygen and water contents in the reaction chamber could be known by the decrease due to etching in the film thickness of silicon oxide formed by the oxidation of silicon.

That is, in system A, there are only a very small amount of oxygen and water in the apparatus, so that silicon will not so much oxidized into silicon oxide during temperature rise, resulting in a small etched thickness.

In system B, on the other hand, there are a large amount of oxygen and water in the apparatus, so that silicon is etched much.

The amount of oxygen and water in the reaction chamber is determined by the purity of a gas supplied, the adsorbed water amount in a supply line, the minute leak, the air-tightness of the reaction chamber itself, and the contamination of the reaction chamber when carrying a substrate thereinto. The degree of contamination of the reaction chamber with oxygen or water at the time of carrying a substrate thereinto is largely influenced by whether the substrate is introduced through a load-lock into the reaction chamber (system A) or it is introduced into the reaction chamber opened to the atmosphere. However, even in the case of system B where the substrate is carried into the reaction chamber opened to the atmosphere, as far as the gas in the chamber is sufficiently replaced without temperature rise, the residual oxygen and water amounts are reduced, but the efficiency is not sufficient for mass production. Also, the etched thickness is influenced by the time required for temperature rise to a set temperature. The rate of temperature rise can be increased when the substrate is supported on a substrate holder with a small heat capacity.

Also, in system A, as shown in FIG. 7, the stacking fault density takes a minimal value at about 900 to 950° C., at temperatures higher than which the pre-bake decreases the residual pore density and increases the stacking fault density as described above.

On the other hand, at 850° C., which is lower than that minimal value, the hydrogen pre-bake step brings about a stacking fault density of $10^5/cm^2$. Under these conditions, observation with an HR-SEM of the porous silicon surface after the pre-bake step showed that the state of the residual pores was changed little as compared to that of FIG. 3A. That is, the pore density did not decrease. It is considered that the stacking fault density was as high as $10^5/cm^2$ because a silicon oxide such as a native oxide film remained on the surface of the porous silicon layer.

The above-mentioned Experiments 1 through 4 showed that in such a system (system A in Experiments 1 through 4) where the amounts of water and oxygen in the reaction chamber are reduced in the temperature rise step for pre-bake and in the pre-bake step, the stacking fault density can be reduced by controlling the change in the residual pore density due to pre-bake, the pre-bake temperature, and the pre-bake time.

The following will describe the embodiments of the present invention.

(Embodiment 1)

FIGS. 9A to 9E show a method for forming a semiconductor substrate according to the present invention.

Figure 9A:
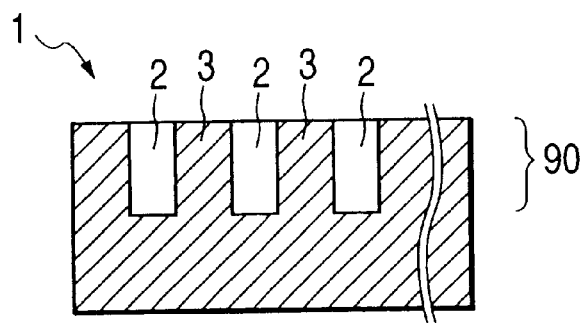
FIGS. 9A, 9B, 9C, 9D and 9E are schematic views illustrating the steps according to the present invention.

As shown in FIG. 9A, a substrate 1 is provided which has a porous silicon layer 90 at least on a free surface side thereof.

Figure 9B:
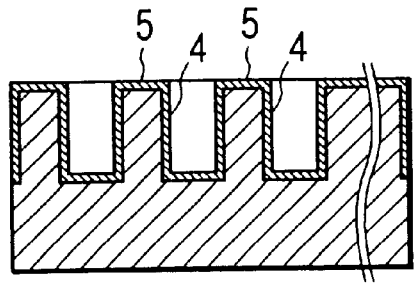

Next, if necessary, as shown in FIG. 9B, a thin protective film 4 is formed on the pore walls 3 of the porous monocrystalline silicon layer (pre-oxidation).

Figure 9C:
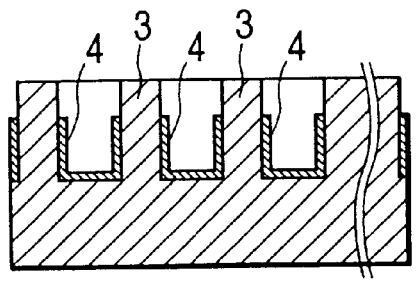

Since this pre-oxidation step causes a protective film 5 such as a silicon oxide film to be formed on the porous silicon layer surface, this substrate is dipped in a low-concentration HF aqueous solution to remove the protective film on the porous silicon surface (hereinafter referred to as "HF dip"). FIG. 9C is a cross-sectional view showing the removed state schematically.

Figure 9D:
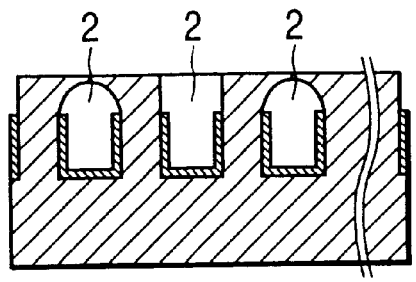
Figure 9E:
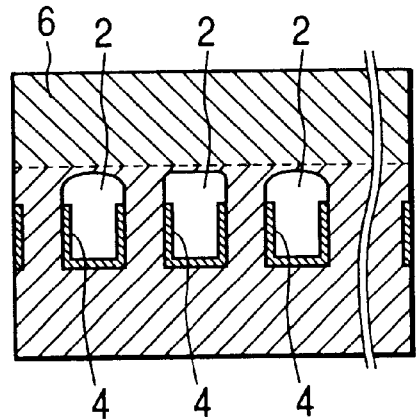

Next, the substrate having the porous monocrystalline silicon formed therein is placed in an epitaxial growth apparatus and heat-treated as shown in FIG. 9D (pre-bake), and a non-porous monocrystalline layer 6 is then formed thereon as shown in FIG. 9E.

The conditions during the pre-bake are such that they satisfy both the conditions 1 under which the change in the thickness (t) of the porous silicon layer, i.e. the decrease (etched thickness $t_e$) in the thickness (t) of the porous silicon layer is 2 nm or less, preferably 1 nm or less in the temperature rise step for the pre-bake and the conditions 2 under which the rate of change (r) in the surface pore density of the porous silicon layer is $1/10000 \leq r \leq 1$, preferably $1/100 \leq r \leq 1$. As to the conditions 1, it is also preferable that the etched thickness is 2 nm or less, preferably 1 nm or less in the temperature rise for the pre-bake and the pre-bake step.

The etched thickness $t_e$ can be expressed as $t_e = t_0 - t_1$, wherein $t_0$ is the layer thickness of the porous silicon layer before the initiation of the pre-bake and $t_1$ is the layer thickness of the porous silicon layer after the completion of the pre-bake. The rate of change (r) in the surface pore density can be expressed as follows:

$$r = d_1/d_0,$$

wherein, $d_0$ is the surface pore density before the pre-bake and $d_1$ is the surface pore density after the pre-bake.

Moreover, the atmosphere employed for this heat treatment is preferably one as not containing a silicon-based gas, more preferably a reducing atmosphere comprising hydrogen gas or nitrogen gas, an inert gas atmosphere, or an ultra-high vacuum. The following will describe this heat treatment.

(1) Putting into Apparatus

The substrate having a porous silicon layer in its surface is put into the reaction chamber (not shown) in which the residual oxygen amount and water amount are suppressed. Heat treatment employed in the present invention may be functionally divided into two steps of a temperature rise step and a native oxide film removal step. Note here that a native oxide film referred to here means a silicon oxide film unintentionally formed on the surface of the porous silicon layer during the steps subsequent to the HF dip step or an oxide film not removed in the HF dip step.

Suppressing the etched thickness is accomplished by controlling the amounts of the residual oxygen and water in the reaction chamber in the temperature rise step and the native oxide film removal step (pre-bake step). The suppress of the residual oxygen and water in the reaction chamber can effectively be attained by suppressing the amounts of oxygen and water contained in the supply gas system and further by carrying the substrate in or out of the reaction chamber through a load-lock chamber, thus preventing the inside of the reaction chamber from being brought into direct contact with the atmosphere.

Also, it is effective to, as the occasion demands, place a purifier for hydrogen as a carrier gas near the apparatus. Also, it is desirable to improve the air-tightness of the supply line and the chamber. By controlling these, it is possible, as mentioned above, to control the etched thickness of the porous silicon layer to 2 nm or less, preferably 1 nm or less during the two steps of the temperature rise step and the native oxygen film removal step.

The method for suppressing the etched thickness, however, is not limited to the above-mentioned.

(2) Temperature Rise Step

The substrate with the porous silicon layer formed on its surface, after being placed in the reaction chamber, is heated.

When the reaction chamber is formed of a light transmissive material such as quartz, the substrate is heated by irradiation with an infrared lamp outside the reaction chamber. Besides the irradiation with an infrared lamp, induction heating using radio frequency, resistance heating, etc, may be employed. Also besides quartz, the reaction chamber may be formed of stainless steel, SiC or the like. The larger the temperature rise rate, the more effectively the oxidation/etching due to the residual oxygen and water can be suppressed. The temperature rise rate is preferably 1° C./sec or larger, more preferably 5° C./sec or larger.

When a substrate is carried into the reaction chamber not through a load-lock chamber, the reaction chamber, after the carrying in, is purged sufficiently and, after removing oxygen and water contaminated into the chamber, the substrate is heated to effect temperature rise. Anyway, it is desired to conduct this treatment in an ultra-high vacuum or non-oxidizing atmosphere.

(3) Native Oxide Film Removal Step

Following the temperature rise step, the native oxide film removal step is carried out. That is, a native oxide film is removed by the heat treatment in a hydrogen atmosphere, a hydrogen-containing reducing atmosphere, or ultra-high vacuum. In this case, the rate of change r of the surface pore density of the porous silicon layer is preferably 1/10000 or higher, preferably 1/100 or higher. Note here that the value of r is not more than 1.

To implement the above conditions, the attainable temperature during the heat treatment, i.e. the pre-bake temperature, is not less than 850° C. and not more than 1000° C., preferably not less than 870° C. and not more than 970° C.

The pressure, although not particularly restricted, is the atmospheric pressure or less, preferably 700 Torr or less, more preferably 100 Torr or less.

The heat treatment time except for the temperature rise step, i.e. the pre-bake time is 200 seconds or less, preferably 100 seconds or less, more preferably 60 seconds or less, even more preferably 10 seconds or less, and it is preferable to lower the temperature immediately after that time has elapsed. Anyway, the pre-bake time should preferably be as short as possible so long as a native oxide film can be removed.

Since a native oxide film is eliminated into the gas phase by the reaction of $SiO_2 + Si \rightarrow 2\ SiO\uparrow$, if the thickness of the native oxide film is too large, silicon in and near the porous silicon layer surface is etched.

A native oxide film is formed during rinsing after the HF dip step, in the air until being placed into an epitaxial growth apparatus after being rinsed and dried, during being placed into the epitaxial growth apparatus, and during the temperature rise step. If, in particular, water and oxygen contents remain in the temperature rise step, silicon is oxidized with temperature rise to form a silicon oxide film. As a result, the thus formed silicon oxide reacts with neighboring silicon to etch it.

Also, the thicker the silicon oxide film formed during the temperature rise, the longer the heat treatment time required to completely remove the formed silicon oxide film. If the heat treatment time is thus elongated, the structural change of the porous silicon surface will proceed as described below, which is not desirable.

According to the present invention, the etched thickness should be at most 2 nm or less, preferably 1 nm or less. The less silicon etched thickness means that the degree of silicon oxidation in the apparatus is small.

If this heat treatment continues, the migration of surface atoms takes place in order to smooth a minute unevenness in the porous silicon surface thereby to reduce the surface energy, thus eliminating most of the surface pores. However, as can be seen from the above-mentioned experiments, a large change in the pore density increases the pore diameter of the residual pores greatly, so that it is desirable to control the change in the pore density in four digits or less.

By the stress acting between the porous silicon and the non-porous monocrystalline silicon, the crystal Lattice in the porous silicon layer surface is distorted; therefore, it is considered that if the surface pore density is decreased, this distortion is concentrated at the peripheral portion of the residual pores remaining after the heat treatment, so that crystal defects may be easily introduced into the residual pore portions.

According to the present invention, by starting to supply a source gas for forming a non-porous thin film to the porous silicon layer surface before the pore density is decreased by four digits or more, preferably by two digits or more by the heat treatment, the concentration of the distortion to the residual pore portion due to the decrease in the pore density is prevented, thus suppressing the introduction of stacking faults. This method is effective in such an environment that the water and oxygen contents in the apparatus are reduced to such an extent as to meet the conditions of the etched thickness of silicon during the heat treatment being as small as 2 nm or less.

So long as the etched thickness of silicon is restricted within the above-mentioned range, the native oxide film may be removed in other steps using HF gas.

(4) Epitaxial Growth

After the heat treatment step, a source gas is supplied to seal the pores of the porous member and to form a non-porous monocrystalline layer to a desired film thickness. Thus, it is possible to form on porous silicon a non-porous monocrystalline layer with a reduced stacking fault density. When the non-porous monocrystalline layer is of monocrystalline silicon, the source gas includes $SiH_4$ (silane), $SiH_2Cl_2$ (dichlorosilane), $SiHCl_3$ (trichlorosilane), $SiCl_4$ (tetrachlorosilane), $Si_2H_6$ (disilane), etc.

The non-porous monocrystalline layer may be of homoepitaxially grown silicon, heteroepitaxially grown silicon germanium, silicon carbide, gallium arsenide, indium phosphorus, etc.

(Porous Silicon Layer)

The porous silicon used in the present invention is essentially the same as that studied up to now since being discovered by Uhlir et al. in 1964 and is produced by the anodization method, etc., but not restricted in terms of the substrate impurities, face orientation, production method, etc. as far as it is porous silicon.

When a porous silicon layer is formed by the anodization method, the anodizing solution is an aqueous solution containing hydrofluoric acid as the main component. Since gases generally tend to adhere to the surfaces of electrodes or silicon during anodization to make the porous layer non-uniform, generally alcohol such as ethanol or propanol is added to enlarge the contact angle thereby to enhance the removal of the adhering bubbles, thus allowing the anodization to occur uniformly. Of course, even without alcohol, the porous substance is formed. When the porous silicon according to the present invention is used in the FIPOS method, a porosity of about 56% is suited and if it is used in the bonding method, a lower porosity of about 50% or less, preferably 30% or less is suited, although not restricted thereto.

Since the porous silicon layer is formed by etching as described above, the relevant surface has, besides pores penetrating deep into the porous substance, such shallow pores as to be expressed as shallow unevenness such that they can be observed with a field emission type scanning electron microscope (FESEM).

A less porosity (%) of the porous silicon results in a less stacking fault density of the porous substance. Porous silicon with a low porosity can be formed by, for example, enhancing the HF concentration, decreasing the current density, or increasing the temperature at time of anodization. Specifically, the term "low porosity" refers to 10% to 30%.

Also, the porous monocrystalline silicon layer may be made by making porous only a main surface layer of a silicon substrate or the entire silicon substrate.

(Pre-Oxidation)

In the present invention, as the occasion demands, a protective film is formed on the pore walls of the porous silicon layer. Since the wall between adjacent pores of the porous silicon is as extremely thin as several nm to some tens nm, adjacent pores of the porous layer may be agglomerated, coarsened, or even discontinued by the heat treatment during the epitaxial growth or the thermal oxidation of the epitaxially grown layer, or after the bonding. The agglomeration and coarsening phenomenon of the pores of the porous layer may lead to decrease in the selective etch rate and degradation of etch selectivity. In the case of FIPOS, the increase in the pore wall thickness and the discontinuing of the pores inhibit the proceeding of the porous layer oxidation, thus making it difficult to completely oxidize the porous layers. To guard against this, thermal oxidation or the like method is conducted after the porous layer is formed, to form a thin protective film at the pore walls beforehand, thus suppressing the agglomeration and coarsening of the pores. When forming the protective layer, especially in the case of using the oxidation, it is essential to leave a monocrystalline silicon region inside the pore walls. Therefore, it is enough to provide a film thickness of several nm. The protective film may be, besides a silicon oxide film, a silicon nitride film.

Note here that if, when SOI substrates are produced by the bonding method, the post-steps subsequent to the heat treatment after the bonding are carried out at a sufficiently low temperature to suppress the structural change of the porous substance, this step can be omitted.

(HF Dip)

The porous silicon layer subjected to the above-mentioned pre-oxidation may be subjected to the HF dip treatment.

As to the HF dip treatment, Sato et al., (N. Sato, K. Sakaguchi, K. Yamagata, Y. Fujiyama, and T. Yonehara, Proc. of the Seventh Int. Symp. on Silicon Mater. Sci. and Tech., Semiconductor Silicon, (Pennington, The Electrochem. Soc. Inc., 1994), p. 443) report that by elongating the HF dip treatment time, the stacking fault density can be reduced to about $10^3/cm^2$. Further experiments by the present inventor showed that in some cases of the HF dip treatment, a hydrofluoric acid solution intrudes deep into the porous silicon locally to remove very thin oxide films formed by the pre-oxidation on the pore side walls. This sometimes resulted in structural coarsening locally in the porous silicon layer, so that the porous silicon could not be removed even by the selective etching, being left in the shape of islands. That is, it was found that it is not always preferable to carry out HF dip treatment in excess of the time or the concentration which is at least required to remove the native oxide film on the surface.

Also, when the HF dip treatment is carried out for a long time, some annealing temperatures employed after the bonding may cause the proceeding of the structural coarsening of the porous layers, thus leaving some portions not etched (etch residue) after the etching of the porous silicon, so that it is desirable to control the HF dip time within an appropriate range.

After the HF dip treatment, rinsing and drying can be carried out to decrease the residual HF concentration in the pores of the porous substance.

(Sealing of Pores by Supply of a Slight Amount of a Source Gas)

According to the present invention, it is desirable to use a silicon-based gas such as $SiH_2Cl_2$, $SiH_4$, $SiHCl_3$, $SiCl_4$, etc. at the initial growth stage of sealing the pores of the surface of the porous substance and to set the flow rate of the source gas in such a way as to give a growth rate of 20 nm/min or less, preferably 10 nm/min or less, more preferably 2 nm/min or less. This further reduces the crystal defects. In the case of the MBE method or the like where silicon is supplied from a solid source and the substrate temperature is as low as 800° C. or less, the growth rate is preferably 0.1 nm/min or less. After the blocking of pores is completed by the step of supplying a slight amount of a source gas, which is also referred to as "pre-injection step", the growth rate is not limited in particular. It may be carried out under the same conditions as those for the growth on ordinary bulk silicon. In this regard, the portion sealed in the pre-injection step is a surface portion of the porous layer. Otherwise, the growth may be continued at the same growth rate as that for the above-mentioned step of supplying a slight amount of a source gas or the gas species may be changed, which does not depart from the scope of the invention. Also, the step following the step of supplying a slight amount of a source gas may be a step of once stopping the supply of a source gas and then supplying a desired source gas to continue the growth. In N. Sato et al., Jpn. J. Appl. Phys. 35 (1996) 973 is reported that as compared to the conventional methods, the stacking fault density can be reduced by decreasing the supply rate of the slight amount of $SiH_2Cl_2$ at the initial stage of the growth. However, such a method is the same as the conventional ones in a respect that the stacking fault density is reduced by increasing the temperature of pre-bake before epitaxial growth and sometimes results in occurrence of etch residue by the coarsening of the porous layer structure as mentioned above. The present invention makes it possible to perform the heat treatment before the growth at 900 to 950° C., which is lower than the conventional temperatures, thus suppressing coarsening of the porous structure.

According to the present embodiment, it is possible to avoid the heat treatment at high temperatures employed in the conventional methods, by a substrate having a porous silicon layer in an apparatus in which silicon is etched in a less amount during the heat treatment, to control the heat treatment time before the growth. With this, the crystal defect density can be reduced, thus enabling it to suppress the coarsening of the porous structure and the discontinuing of the pores.

Further, since it is possible to control the growth temperature, pressure, gas flow rate, etc. independently of the above-mentioned initial growth step, the treatment temperature may be decreased to suppress the coarsening of the porous silicon structure, the auto-doping of such impurities as boron, phosphorus, etc. from porous silicon, or the solid-phase diffusion, or the growth temperature and the flow rate of a silicon source gas may be increased to accelerate the growth rate, thus forming a thick nonporous monocrystalline silicon layer in a short lapse of time.

Moreover, the non-porous monocrystalline layer to be grown is, as mentioned earlier, not limited to silicon, but may be of a Group IV type heteroepitaxy material such as SiGe, SiC, etc. or such a compound semiconductor as those represented by GaAs. Also, it is within the scope of the invention to use a silicon-based gas in the above-mentioned step of supplying a slight amount of a source gas and then to use another gas to perform heteroepitaxial growth.

Further, it is also preferred that after the step of sealing the pores of the porous layer surface (i.e., the pre-bake/pre-injection steps) and before the growth of a desired film, the substrate is heat-treated at a temperature higher than the temperatures of the pre-bake/pre-injection in an atmosphere not containing any source gas of the semiconductor film (for example, a reducing atmosphere comprising hydrogen). This heat treatment is referred to as "inter baking".

(Embodiment 2)

The following describes with reference to FIG. 10 an example of producing a semiconductor substrate having a non-porous monocrystalline silicon layer with a low stacking fault density on a porous monocrystalline silicon layer.

A substrate 10 having a porous silicon layer 11 is produced by making porous entirely or partially at least one surface side of a monocrystalline silicon base member (FIG. 10A). FIG. 10A shows a case of making partially porous the silicon base member.

Almost the same heat treatment as given in Embodiment 1 is performed, i.e. treatment in which silicon is etched as much as 2 nm or less, preferably 1 nm or less in the temperature rise step for pre-bake and the pre-bake step and the rate of change of the porous silicon layer surface pore density r is 1/10000 or larger, preferably 1/100 or larger (FIG. 10B). Then, a non-porous monocrystalline layer 12 is formed on the porous monocrystalline silicon layer (FIG. 10C).

In this case, the above-mentioned pre-oxidation or HF dip can be performed prior to the heat treatment. Also, it is desirable to, after the heat treatment, supply a slight amount of a source gas to carry out the pore blocking step, i.e. pre-injection step.

Next, the bonding method is used to produce an SOI substrate, in such a way that an insulator layer is first formed on a main surface of at least one of the non-porous monocrystalline silicon and a second substrate and then, they are bonded to each other so as to locate the non-porous monocrystalline layer at the inside, thus forming a multi-layer structure member (FIG. 10D). Then, as occasion demands, heat treatment is performed to enhance the bonding strength, and then the removal step by selective etching or the like of the porous silicon is carried out (FIG. 10E) to transfer the epitaxially grown layer on the porous silicon onto the second substrate, thus obtaining the SOI structure.

Note here that the insulator layer may be an oxide film formed by oxidizing the surface of the non-porous monocrystalline layer or an oxide film formed on the surface of the second substrate.

Also, oxide films may be formed on both the non-porous monocrystalline layer surface and the surface of the second substrate.

Further, the non-porous monocrystalline layer to be formed on the porous silicon layer may be, besides a non-porous monocrystalline silicon layer, a heteroepitaxial layer.

The insulator layer 14 may be omitted if the second substrate itself is of a light transmissive insulating material such as quartz, quartz glass, plastic, or the like.

If the thus obtained bonding strength is strong enough to stand the subsequent steps, the process proceed to the subsequent steps. A mechanical method such as grinding or a chemical method such as etching is performed to remove the back side of the substrate on which the porous layer has been formed, to expose the porous layer. Alternatively, the back side portion of the substrate may be separated in the porous layer to expose the porous layer. The separation may be carried out mechanically by inserting a wedge, etc. into the substrate from the edge surface or spraying a fluid as in a water jet or may be carried out utilizing ultrasonic waves or thermal stress. It is desirable to make it easy to separate the portion by beforehand forming partially a highly porous sublayer with a low mechanical strength in the porous layer. For example, the porous layer may be constituted of a first porous layer having a porosity of 10 to 30%, a second porous layer, formed on the first porous layer, having a porosity of 30 to 70%, and a non-porous monocrystalline layer formed on the second porous layer.

(Selective Etching of Porous Substance)

The porous layer remaining on the non-porous monocrystalline layer 12 is removed by selective etching. Preferably, the selective etchant is a mixture liquid of HF, $H_2O_2$, and $H_2O$. To remove bubbles generated during the reaction, ethyl alcohol, isopropyl alcohol, or a surfactant may be added to the mixture liquid.

The present method suppress the structural change and coarsening of the porous layer and the discontinuing of pores, thus reducing the degradation of selectivity in selective etching.

Note here that there is no particular limitation to the second substrate to which is bonded the non-porous monocrystalline silicon layer formed on the porous silicon, so long as it has such smoothness that it can be in close contact with the surface of the non-porous monocrystalline silicon or of a film formed thereon. For example, there can be used a silicon wafer, a silicon wafer having a thermally oxidized silicon film formed thereof, a transparent substrate such as a quartz wafer, a sapphire wafer, or the like. When it is to be bonded to an insulating substrate, the insulating layer 14 can be omitted.

Also, the non-porous monocrystalline silicon layer can be bonded as such to the second substrate, or otherwise may first be subjected to formation of a film thereon and then be bonded to the second substrate. The film to be formed may be a film of silicon oxide or silicon nitride, or a monocrystalline film of SiGe, SiC, or a Group III–V compound such as InP, GaAs, InGaAsP, and GaAsAl, or a Group II–VI compound, or may be a stack thereof.

It is preferable to rinse cleanly the bonding surfaces before the bonding. The rinsing step may be of a prior one which is used in the conventional semiconductor processes. Also, the bonding strength can be improved by irradiating them with nitrogen plasma etc. before bonding.

After the bonding, heat treatment is preferably carried out to enhance the bonding strength.

(Hydrogen Annealing)

After the porous silicon is removed, the non-porous monocrystalline layer 12 has unevenness which reflects the period between the pores and side walls of the porous silicon which were present on the surface. This surface corresponds to the interface between the non-porous monocrystalline silicon and the porous silicon, both of which are of monocrystalline silicon with only a difference of whether they have pores or not. The unevenness in the surface can be removed by polishing typified by Chemical Mechanical Polishing (CMP) and, when subjected to heat treatment in a reducing atmosphere containing hydrogen (referred to as "hydrogen annealing"), can be removed substantially without reducing the thickness of the non-porous monocrystalline silicon film. The hydrogen annealing can be performed at atmospheric pressure, a high pressure, a reduced pressure, or a slightly reduced pressure. Also, the temperature is from 800° C. to the melting point of monocrystalline silicon, preferably 900° C. to 1350° C.

(Boron Concentration Control)

Although, on the other hand, crystal growth of an epitaxial layer on a porous silicon layer is much better in the case of making $p^+Si$ ($^-0.01$ Ωcm boron doped) porous than in the case of anodizing $p^-Si$($^-0.01$ Ωcm boron doped), there is a case where the high-concentration boron is auto-doped or solid-phase diffused during the (epitaxial growth into the epitaxial silicon layer. The boron diffused into the epitaxial silicon layer may remain after the porous silicon is removed, bringing about troubles in control of the impurity concentration of active layers in SOI. To solve this problem, Sato et al. proposed such a method (N. Sato and T. Yonehara, Appl. Phys. Lett. 65 (1994), p. 1924) that an SOI structure completed substrate is annealed in hydrogen to remove a native oxide film on the SOI layer surface with a low boron diffusion speed and the boron in the SOI layer are diffused outside to attain a low boron concentration. However, an excessive diffusion of boron into the epitaxial silicon layer may cause the incorporation of boron into a buried oxide film as well as the elongation of hydrogen annealing time, thus resulting in an increase in the process cost, or lowering in controllability of the boron concentration in the buried oxide film. To solve this problem, it is effective to form the epitaxial silicon layer at a lower temperature to suppress the diffusion of boron. According to the present invention, it is possible to set appropriate conditions for the formation of the epitaxial silicon layer because they can be set independently of the blocking of the pores.

(FIPOS Method)

Also, instead of the bonding method, the FIPOS method may be used to remove partially the epitaxially grown layer and then selectively oxidize porous silicon by the oxidation treatment to thereby form an SOI structure. The present method suppresses the structural change and coarsening of the porous layer and the discontinuing of pores, thus reducing the degradation in selectivity in the selective oxidation.

(Heteroepitaxy)

On the porous silicon layer, besides silicon, a non-porous monocrystalline layer made of GaAs or another compound semiconductor or a Group IV type material such as SiC, SiGe, etc. may be heteroepitaxially grown. In heteroepitaxy, the porous silicon acts as a stress relaxation material, thus relaxing stress due to lattice mismatching and, moreover, reducing the crystal defect density of the non-porous monocrystalline silicon layer to reduce also the defect density of the heteroepitaxially grown layer. The present method suppresses the structural change and coarsening of the porous layer and the discontinuing of pores, thus reducing the degradation of the stress relaxation effect.

(Other Applications)

Since porous silicon has the gettering action, it is possible to produce substrates having a high impurity tolerance against metal contamination etc. during processes by, instead of forming the SOI structure as mentioned above, directly forming MOS transistors and bipolar transistors in the non-porous monocrystalline silicon layers produced by the present invention.

Since the present method, as compared to the conventional ones, can be lower the heat treatment temperature, especially that before the sealing of pores, it is possible to suppress the agglomeration, expansion, and discontinuity of pores in the porous layers, thus preventing the degradation of the selectivity in selective etching of the porous layer in the steps subsequent to the bonding step. That is, it is possible to improve the crystallinity of the non-porous monocrystalline silicon layer without generating etch residue in the removal of the porous layer. Also, the FIPOS method does not degrade the rate of selectively oxidizing the porous layer.

The following will describe the specific embodiments of the present invention.

EXAMPLE 1

950° C., 600 Torr. Pre-Bake (2 Seconds, 120 Seconds), Pre-Injection, Epi-2 μm

1) Boron was added as a p-type impurity, to provide CZ6-inch (100) p$^+$ silicon wafers with a resistivity of 0.015 Ωcm+/−0.005 Ωcm.
2) In a solution in which 49% HF and ethyl alcohol were mixed at a ratio of 2:1, the above-mentioned silicon wafer was disposed as the anode and a 6-inch-diameter platinum plate was disposed as the cathode in opposition to the silicon wafer. The back side of the silicon wafer was made in opposition to a surface side of another p$^+$ silicon wafer with the same solution therebetween, thus permitting the most distant wafer to face a 6-inch-diameter platinum plate. The respective solutions between the wafers were separated from each other, thus preventing electrical conduction therebetween. Between the above-mentioned silicon wafer and the platinum plate was flown a current at a current density of 10 mA/cm$^2$ for 12 minutes to anodize the silicon wafers, thus forming a porous silicon layer of 12 μm thickness on each surface.
3) Subsequently, each wafer on which a porous silicon layer was thus formed was subjected to oxidization at 400° C. in an oxygen atmosphere for 1 hour. Since this oxidation treatment provided only about 50 Å or less thickness of an oxide film, the silicon oxide film was formed only on the porous silicon surface and the pore side walls, leaving a monocrystalline silicon region inside of the wafer.
4) The above-mentioned wafers were dipped in an HF aqueous solution diluted to 1.25% for 30 seconds and then in pure water for 10 minutes for overflow rinsing, to remove the ultra-thin silicon oxide film formed on the porous layer surface.
5) The above-mentioned wafers, as placed on a wafer carrier, were set in a load-lock chamber of the leaf-type epitaxial CVD growth apparatus in which the load-lock chamber for setting wafers on the wafer carrier, a transport chamber having a wafer transporting robot, and a process chamber were connected. The load-lock chamber was evacuated with a dry pump from the atmospheric pressure down to 1 Torr or less and N$_2$ gas was introduced thereinto to make the pressure 80 Torr. The transport chamber is held at 80 Torr with the introduction of N$_2$ gas beforehand. In the process chamber was placed a susceptor which is made of carbon coated with CVD-SIC for holding wafers. The susceptor was heated to about 750° C. by an IR lamp beforehand. A hydrogen purifier using a heated palladium alloy supplied purified hydrogen gas to the process chamber via an about 10-meter long internally polished stainless steel pipe.

The wafers were carried by the transport robot from the load-lock chamber via the transport chamber to the process chamber and placed on the susceptor.
6) After the process chamber was set at a pressure of 600 Torr, the wafers transported on the susceptor was heated with an IR lamp at a rate of 100° C./min up to 950° C. and held at this temperature for 2 seconds and then cooled down to 750° C. and taken out again with the transport robot via the transport chamber to the load-lock chamber. Another wafer was held at 950° C. for 120 seconds and then otherwise subjected to the same treatments as described above and then returned to the Load-lock chamber.
7) The load-lock chamber was opened to the atmosphere and the wafers were taken out. The porous layer surfaces were observed with an HR-SEM to show that the 2 seconds treated wafer has a surface pore density of the porous layer of 6.8×10$^{10}$/cm$^2$ and the 120 seconds treated wafer had a porous surface pore density of 3.0×10$^9$/cm$^2$. Since the sample had a pore density of 9.8×10$^{10}$/cm$^2$ before being placed in the expitaxial growth apparatus, the rate of change r were 7/10 and 3/100, respectively. That is, they satisfied the conditions 2.
8) Further, SOI substrates provided beforehand were dipped into an HF solution, then cleaned with water and dried, and measured for the film thickness of the SOI layer with an optical interference type film thickness meter and subjected to treatments 5) and 6) above and taken out from the load-lock chamber. The thicknesses of the SOI layers were measured again to find that the film thickness reduced only by less than 1 nm in the both samples. That is, they satisfied the conditions 1.
9) The wafers subjected to treatment 4) above were transported to the process chamber of the epitaxial growth apparatus in the manner as mentioned in 5) above.
10) After the pressure of the process chamber was set at 600 Torr, the wafer transported on the susceptor was heated with an IR lamp at a rate of 100° C./min and subjected to heat treatment (pre-bake treatment) to be held at 950° C. for 2 seconds; then SiH$_4$ was added to the hydrogen carrier gas so as to provide a concentration of 28 ppm to thereby treat the wafer for 200 seconds and the addition of SiH$_4$ was stopped. Then the pressure was decreased to 80 Torr and the temperature, down to 900° C., and SiH$_2$Cl$_2$ was added so as to provide a concentration of 0.5 mol % to thereby form a non-porous monocrystalline silicon film in the thickness of 2 μm. Then, the temperature was decreased to 750° C. in the hydrogen atmosphere and the wafer was again taken out with the transport robot via the transport chamber to the load-lock chamber. The other wafer was subjected to the pre-bake treatment at 950° C. in a hydrogen atmosphere for 120 seconds and otherwise underwent the same treatment as described above and returned to the load-lock chamber. Note here that when the SiH$_4$ was added to provide the concentration of 28 ppm, the growth rate was 3.3 nm/min. Also note that 1 mol %=10$^4$ ppm.
11) The wafers as finished of treatment 10) above were etched for defect revealing to reveal crystal defects introduced into the non-porous monocrystalline silicon layer and then observed with a Nomarski differential interference microscope. Thus observed defects had a stacking fault percentage of 99% or more. The stacking fault density was 84/cm$^2$ for the 2 seconds pre-bake and 260/cm$^2$ for the 120 seconds pre-bake, thus being reduced drastically as compared to 1.5×10$^4$/cm$^2$ for the 120-second pre-bake treatment at 1100° C. In the case of a lower defect density, in particular for the 2 seconds pre-bake at 950° C., a stacking fault density less than 100/cm$^2$ was obtained.

EXAMPLE 2

950° C., 600 Torr, Pre-Bake (2 seconds), Pre-Injection, Epi-0.32 μm

1) CZ8-inch (100) p+ silicon wafers were provided which was obtained by adding boron as a p-type impurity to provide a resistivity of 0.015 Ωcm+/−0.01 Ωcm.

2) In a solution of a mixture of 49% HF and ethyl alcohol at a ratio of 2:1, the above-mentioned wafer was disposed as the anode and a 6-inch-diameter platinum plate was disposed as the cathode in opposition to the wafer. The back side of the silicon wafer was made in opposition to a side of another $p^+$ silicon wafer with the same solution therebetween, thus permitting the most distant wafer to face a 6-inch-diameter platinum plate. The respective solutions between the wafers were separated from each other, so as not to be in electrical conduction with each other. Between the silicon wafer and the platinum plate was flown a current having a current density of 10 mA/cm$^2$ for 12 minutes to anodize the silicon wafers so as to form a plurality of the wafers each having a porous silicon layer of a thickness of 12 μm on the surface.

3) Subsequently, each wafer on which a porous silicon layer was formed was subjected to oxidization in an oxygen atmosphere at 400° C. for 1 hour. Since this oxidization treatment provided only about 50 Å or less thickness of an oxide film, the silicon oxide film was formed only on the porous silicon surface and the pore side walls, leaving a monocrystalline silicon region inside of the wafer.

4) The above-mentioned wafers were dipped for 30 seconds in an HF aqueous solution diluted to 1.25% and then in pure water for 10 minutes for overflow rinsing, to remove the ultra-thin silicon oxide film formed on the porous layer surface.

5) The above-mentioned wafers were placed on a wafer carrier and set in a load-lock chamber of the expitaxial CVD-growth apparatus in which the load-lock chamber to set wafers on the wafer carrier, a transport chamber having a wafer transport robot, and a process chamber were connected. The load-lock chamber was evacuated with a dry pump from the atmospheric pressure down to 1 Torr or less, and N$_2$ gas was introduced thereinto to increase the pressure to 80 Torr. The transport chamber was held at 80 Torr by introducing N$_2$ gas beforehand. In the process chamber was placed a susceptor which is made of carbon coated with CVD-SiC for holding wafers. The susceptor was heated with an IR lamp to about 750° C. beforehand. Into the process chamber was supplied purified hydrogen gas from a hydrogen purifier using a heated palladium alloy via an about 10-meter long internally polished stainles steel pipe.

The wafers were carried with the transport robot from the load-lock chamber via the transport chamber to the process chamber and placed onto the susceptor.

6) The wafers thus transported on the susceptor were heated with an IR lamp at a rate of 100° C./min and held at 950° C. for pre-bake for 2 seconds. The conditions at this time were such that the etched thickness was less than 1 nm and the rate of change r of the surface pore density was 7/10, both meeting the conditions 1 and 2 as defined in the present invention.

Next, SiH$_2$Cl$_2$ was added to the hydrogen carrier gas to provide a concentration of 28 ppm to carry out treatment for 200 seconds (at a growth rate of 2.6 nm/min) and then the temperature was lowered to 900° C.; and SiH$_2$Cl$_2$ was then added so as to provide a concentration of 0.5 mol % to form non-porous monocrystalline silicon layers as thick as 0.32 μm; then the temperature was lowered to 750° C. in the hydrogen atmosphere and the wafers were taken out again with the transport robot via the transport chamber to the load-lock chamber. The thus formed non-porous monocrystalline silicon layers have an average thickness of 0.32 μm and the maximum value–the minimum value=8 nm.

7) Each wafer on which the non-porous monocrystalline silicon layer was expitaxial-grown was set in a vertical type furnace and subjected to heat treatment at 1000° C. in a mixture gas of water vapor formed by burning oxygen and hydrogen and the remaining oxygen to oxidize the surface of the non-porous monocrystalline silicon to thus form a silicon oxide film with a thickness of 208 nm.

8) Each of the above-mentioned wafer and a second silicon wafer were cleaned in the cleaning line of a silicon semiconductor process and then superposed upon each other gently with their primary main surfaces facing each other and pressed at the middle thereof to integrate them.

9) Subsequently, the thus integrated wafers were set in the vertical type furnace and subjected to heat treatment at 1100° C. in an oxygen atmosphere for 1 hour.

10) The back side of each of the wafers on which the porous silicon was formed was ground with a grinder to expose the porous silicon on the whole wafer surface.

11) The thus exposed porous silicon layers were dipped into a mixture solution of HF and aqueous hydrogen peroxide solution to remove all of the porous silicon in about 2 hours, showing on the whole wafer surface the interference color due to the non-porous monocrystalline silicon layer and the thermally oxidized silicon film.

12) The wafers as finished of treatment 11) above were cleaned in a cleaning line generally used in the silicon semiconductor device process and set in a vertical type hydrogen annealing furnace and subjected to heat treatment in a 100%-hydrogen atmosphere at 1100° C. for 4 hours. The hydrogen gas used was purified by a commercially available hydrogen purifier using a palladium alloy connected to the apparatus via an about 7-meter long stainless steel pipe polished internally.

13) Thus, SOI structure wafers were produced in which a 200 nm thick silicon oxide layer and a 200 nm thick monocrystalline silicon layer were stacked on the second silicon wafer.

The monocrystalline silicon layers had an average thickness of 201 nm and the maximum value−minimum value=8 nm.

14) The wafers as finished of treatment 13) above were subjected to defect revealing etching to remove the monocrystalline silicon layer by the thickness of 130 nm and then dipped into a 49% HF solution for 3 minutes. As a result, the buried oxide film was etched by the HF through the portions of crystal defects remaining in the monocrystalline silicon layer etched by the defect revealing etching, which could be easily determined for the defect density with a Nomarski differential interference microscope. The thus observed defect density was 64/cm$^2$. The stacking faults introduced into the non-porous monocrystalline silicon layer was found to be reduced by the hydrogen annealing. Thus, thin film SOI layers with a uniform film thickness and a defect density less than 100/cm$^2$ were obtained.

EXAMPLE 3

950° C., 600 Torr, Pre-Bake (2 Seconds, 120 Seconds), No pre-Injection, Epi-2 μm 1) Boron was added as a p-type impurity, to provide CZ6-inch (100) p$^+$ silicon wafers with a resistivity of 0.015 Ωcm+/−0.005 Ωcm.

2) In a solution in which 49% HF and ethyl alcohol were mixed at a ratio of 2:1, the above-mentioned silicon wafer was disposed as the anode and a 6-inch-diameter platinum plate was disposed as the cathode in opposition to the silicon wafer. The back side of the silicon wafer was made in opposition to a surface side of another p$^+$ silicon wafer with the same solution therebetween, thus permitting the most distant wafer to face a 6-inch-diameter platinum plate. The respective solutions between the wafers were separated from each other, thus preventing electrical conduction therebetween. Between the above-mentioned silicon wafer and the platinum plate was flown a current at a current density of 10 mA/cm$^2$ for 12 minutes to anodize the silicon wafers, thus forming a porous silicon layer of 12 $\mu$m thickness on each surface.

3) Subsequently, each wafer on which a porous silicon layer was thus formed was subjected to oxidization at 400° C. in an oxygen atmosphere for 1 hour. Since this oxidation treatment provided only about 50 Å or less thickness of an oxide film, the silicon oxide film was formed only on the porous silicon surface and the pore side walls, leaving a monocrystalline silicon region inside of the wafer.

4) The above-mentioned wafers were dipped in an HF aqueous solution diluted to 1.25% for 30 seconds and then in pure water for 10 minutes for overflow rinsing, to remove the ultra-thin silicon oxide film formed on the porous layer surface.

5) The above-mentioned wafers, as placed on a wafer carrier, were set in a load-lock chamber of the epitaxial CVD growth apparatus in which the load-lock chamber for setting wafers on the wafer carrier, a transport chamber having a wafer transporting robot, and a process chamber were connected. The load-lock chamber was evacuated with a dry pump from the atmospheric pressure down to 1 Torr or less and N$_2$ gas was introduced thereinto to make the pressure 80 Torr. The transport chamber is held at 80 Torr with the introduction of N$_2$ gas beforehand. In the process chamber was placed a susceptor which is made of carbon coated with CVD-SiC for holding wafers. The susceptor was heated to about 750° C. by an IR lamp beforehand. A hydrogen purifier using a heated palladium alloy supplied purified hydrogen gas to the process chamber via an about 10-meter long internally polished stainless steel pipe.

The wafers were carried by the transport robot from the load-lock chamber via the transport chamber to the process chamber and placed on the susceptor.

6) After the process chamber was set at a pressure of 600 Torr, the wafers transported on the susceptor was heated with an IR lamp at a rate of 100° C./min up to 950° C. and held at this temperature for 2 seconds and then cooled down to 750° C. and taken out again with the transport robot via the transport chamber to the load-lock chamber. Another wafer was held at 950° C. for 120 seconds and then otherwise subjected to the same treatments as described above and then returned to the load-lock chamber.

7) The load-lock chamber was opened to the atmosphere and the wafers were taken out. The porous layer surfaces were observed with an HR-SEM to show that the 2 seconds treated wafer has a surface pore density of the porous layer of 6.8×10$^{10}$/cm$^2$ and the 120 seconds treated wafer had a porous surface pore density of 3.0×10$^9$/cm$^2$. Since the sample had a pore density of 9.8×10$^{10}$/cm$^2$ before being placed in the expitaxial growth apparatus, the rate of change r were about 7/10 and about 3/100, respectively. That is, they satisfied the conditions 2.

8) Further, SOI substrates provided beforehand were dipped into an HF solution, then cleaned with water and dried, and measured for the film thickness of the SOI layer with an optical interference type film thickness meter and subjected to treatments 5) and 6) above and taken out from the load-lock chamber. The thicknesses of the SOI layers were measured again to find that the film thickness reduced only by less than 1 nm in the both samples. That is, they satisfied the conditions 1.

9) The wafers subjected to treatment 4) above were transported to the process chamber of the epitaxial growth apparatus in the manner as mentioned in 5) above.

10) After the pressure of the process chamber was set at 600 Torr, the wafer transported on the susceptor was heated with an IR lamp at a rate of 100° C./min and subjected to heat treatment (pre-bake treatment) to be held at 950° C. for 2 seconds. Then the pressure was decreased to 80 Torr and the temperature, down to 900° C., and SiH$_2$Cl$_2$ was added so as to provide a concentration of 0.5 mol % to thereby form a non-porous monocrystalline silicon film in the thickness of 2 $\mu$m. Then, the temperature was decreased to 750° C. in the hydrogen atmosphere and the wafer was again taken out with the transport robot via the transport chamber to the load-lock chamber. The other wafer was subjected to the pre-bake treatment at 950° C. in a hydrogen atmosphere for 120 seconds and otherwise underwent the same treatment as described above and returned to the load-lock chamber.

11) The wafers as finished of treatment 10) above were etched for defect revealing to reveal crystal defects introduced into the non-porous monocrystalline silicon layer and then observed with a Nomarski differential interference microscope. Thus observed defects had a stacking fault percentage of 99% or more. The stacking fault density was 170/cm$^2$ for the 2 seconds pre-bake and 2.6×10$^3$/cm$^2$ for the 120 seconds pre-bake, thus being reduced drastically as compared to 1.5×10$^4$/cm$^2$ for the 120-second pre-bake treatment at 1100° C.

EXAMPLE 4

900° C., 450 Torr, Pre-Bake (2 Seconds, 120 Seconds), Pre-Injection, Epi-2 $\mu$m 1) Boron was added as a p-type impurity, to provide CZ6-inch (100) p$^+$ silicon wafers with a resistivity of 0.015 Ωcm+/−0.005 Ωcm.

2) In a solution in which 49% HF and ethyl alcohol were mixed at a ratio of 2:1, the above-mentioned silicon wafer was disposed as the anode and a 6-inch-diameter platinum plate was disposed as the cathode in opposition to the silicon wafer. The back side of the silicon wafer was made in opposition to a surface side of another p$^+$ silicon wafer with the same solution therebetween, thus permitting the most distant wafer to face a 6-inch-diameter platinum plate. The respective solutions between the wafers were separated from each other, thus preventing electrical conduction therebetween. Between the above-mentioned silicon wafer and the platinum plate was flown a current at a current density of 10 mA/cm$^2$ for 12 minutes to anodize the silicon wafers, thus forming a porous silicon layer of 12 $\mu$m thickness on each surface.

3) Subsequently, each wafer on which a porous silicon layer was thus formed was subjected to oxidization at 400° C. in an oxygen atmosphere for 1 hour. Since this oxidation treatment provided only about 50 Å or less thickness of an oxide film, the silicon oxide film was formed only on the porous silicon surface and the pore side walls, leaving a monocrystalline silicon region inside of the wafer.

4) The above-mentioned wafers were dipped in an HF aqueous solution diluted to 1.25% for 30 seconds and then in pure water for 10 minutes for overflow rinsing, to remove the ultra-thin silicon oxide film formed on the porous layer surface.

5) The above-mentioned wafers, as placed on a wafer carrier, were set in a load-lock chamber of the epitaxial CVD growth apparatus in which the load-lock chamber for setting wafers on the wafer carrier, a transport chamber having a wafer transporting robot, and a process chamber were connected. The load-lock chamber was evacuated with a dry pump from the atmospheric pressure down to 1 Torr or less and $N_2$ gas was introduced thereinto to make the pressure 80 Torr. The transport chamber is held at 80 Torr with the introduction of $N_2$ gas beforehand. In the process chamber was placed a susceptor which is made of carbon coated with CVD-SiC for holding wafers. The susceptor was heated to about 750° C. by an IR lamp beforehand. A hydrogen purifier using a heated palladium alloy supplied purified hydrogen gas to the process chamber via an about 10-meter long internally polished stainless steel pipe.

The wafers were carried by the transport robot from the load-lock chamber via the transport chamber to the process chamber and placed on the susceptor.

6) After the process chamber was set at a pressure of 450 Torr, the wafers transported on the susceptor was heated with an IR lamp at a rate of 100° C./min up to 100° C. and held at this temperature for 2 seconds and then cooled down to 750° C. and taken out again with the transport robot via the transport chamber to the load-lock chamber. Another wafer was held at 900° C. for 120 seconds and then otherwise subjected to the same treatments as described above and then returned to the load-lock chamber.

7) The load-lock chamber was opened to the atmosphere and the wafers were taken out. The porous layer surfaces were observed with an HR-SEM to show that the 2 seconds treated wafer has a surface pore density of the porous layer of $7.8 \times 10^{10}/cm^2$ and the 120 seconds treated wafer had a porous surface pore density of $3.0 \times 10^{10}/cm^2$. Since the sample had a pore density of $9.8 \times 10^{10}/cm^2$ before being placed in the expitaxial growth apparatus, the rate of change r were about 8/10 and about 3/100, respectively. That is, they satisfied the conditions 2.

8) Further, SOI substrates provided beforehand were dipped into an HF solution, then cleaned with water and dried, and measured for the film thickness of the SOI layer with an optical interference type film thickness meter and subjected to treatments 5) and 6) above and taken out from the load-lock chamber. The thicknesses of the SOI layers were measured again to find that the film thickness reduced only by less than 1 nm in the both samples. That is, they satisfied the conditions 1.

9) The wafers subjected to treatment 4) above were transported to the process chamber of the epitaxial growth apparatus in the manner as mentioned in 5) above.

10) After the pressure of the process chamber was set at 450 Torr, the wafer transported on the susceptor was heated with an IR lamp at a rate of 100° C./min and subjected to heat treatment (pre-bake treatment) to be held at 900° C. for 2 seconds; then $SiH_4$ was added to the hydrogen carrier gas so as to provide a concentration of 28 ppm to thereby treat the wafer for 200 seconds and the addition of $SiH_4$ was stopped. Then the pressure was decreased to 80 Torr and the temperature, down to 900° C., and $SiH_2Cl_2$ was added so as to provide a concentration of 0.7 mol % to thereby form a non-porous monocrystalline silicon film in the thickness of 2 μm. Then, the temperature was decreased to 750° C. in the hydrogen atmosphere and the wafer was again taken out with the transport robot via the transport chamber to the load-lock chamber. The other wafer was subjected to the pre-bake treatment at 900° C. in a hydrogen atmosphere for 120 seconds and otherwise underwent the same treatment as described above and returned to the load-lock chamber.

11) The wafers as finished of treatment 10) above were etched for defect revealing to reveal crystal defects introduced into the non-porous monocrystalline silicon layer and then observed with a Nomarski differential interference microscope. Thus observed defects had a stacking fault percentage of 99% or more. The stacking fault density was $490/cm^2$ for the 2 seconds pre-bake and $350/cm^2$ for the 120 seconds pre-bake, thus being reduced drastically as compared to $1.5 \times 10^4/cm^2$ for the 120-second pre-bake treatment at 1100° C., so that a defect density less than $1000/cm^2$ was attained.

EXAMPLE 5

870° C., 80 Torr. Pre-Bake (5 Seconds, 60 Seconds), Pre-Injection, Epi-2 μm

1) Boron was added as a p-type impurity, to provide CZ6-inch (100) $p^+$ silicon wafers with a resistivity of 0.015 Ωcm+/−0.005 Ωcm.

2) In a solution in which 49% HF and ethyl alcohol were mixed at a ratio of 2.1:1, the above-mentioned silicon wafer was disposed as the anode and a 6-inch-diameter platinum plate was disposed as the cathode in opposition to the silicon wafer. The back side of the silicon wafer was made in opposition to a surface side of another $p^+$ silicon wafer with the same solution therebetween, thus permitting the most distant wafer to face a 6-inch-diameter platinum plate. The respective solutions between the wafers were separated from each other, thus preventing electrical conduction therebetween. Between the above-mentioned silicon wafer and the platinum plate was flown a current at a current density of 10 mA/cm² for 12 minutes to anodize the silicon wafers, thus forming a porous silicon layer of 12 μm thickness on each surface.

3) Subsequently, each wafer on which a porous silicon layer was thus formed was subjected to oxidization at 400° C. in an oxygen atmosphere for 1 hour. Since this oxidation treatment provided only about 50 Å or less thickness of an oxide film, the silicon oxide film was formed only on the porous silicon surface and the pore side walls, leaving a monocrystalline silicon region inside of the wafer.

4) The above-mentioned wafers were dipped in an HF aqueous solution diluted to 1.3% for 30 seconds and then in pure water for 10 minutes for overflow rinsing, to remove the ultra-thin silicon oxide film formed on the porous layer surface.

5) The above-mentioned wafers, as placed on a wafer carrier, were set in a load-lock chamber of the epitaxial CVD growth apparatus in which the load-lock chamber for setting wafers on the wafer carrier, a transport chamber having a wafer transporting robot, and a process chamber were connected. The load-lock chamber was evacuated with a dry pump from the atmospheric pressure down to 1 Torr or less and $N_2$ gas was introduced thereinto to make the pressure 80 Torr. The transport chamber is held at 80 Torr with the introduction of $N_2$ gas beforehand. In the process chamber was placed a susceptor which is made of carbon coated with CVD-SiC for holding wafers. The susceptor was heated to about 750° C. by an IR lamp beforehand. A hydrogen purifier using a heated palladium alloy supplied purified hydrogen gas to the process chamber via an about 10-meter long internally polished stainless steel pipe.

The wafers were carried by the transport robot from the load-lock chamber via the transport chamber to the process chamber and placed on the susceptor.

6) After the process chamber was set at a pressure of 80 Torr, the wafers transported on the susceptor was heated with an IR lamp at a rate of 100° C./min up to 870° C. and held at this temperature for 5 seconds and then cooled down to 750° C. and taken out again with the transport robot via the transport chamber to the load-lock chamber. Another wafer was held at 870° C. for 60 seconds and then otherwise subjected to the same treatments as described above and then returned to the load-lock chamber.

7) The load-lock chamber was opened to the atmosphere and the wafers were taken out. The porous layer surfaces were observed with an HR-SEM to show that the 5 seconds treated wafer has a surface pore density of the porous layer of $4.1 \times 10^{10}/cm^2$ and the 60 seconds treated wafer had a porous surface pore density of $1.1 \times 10^{10}/cm^2$. Since the sample had a pore density of $9.8 \times 10^{10}/cm^2$ before being placed in the expitaxial growth apparatus, the rate of change r were about 4/10 and about 1.1/10, respectively. That is, they satisfied the conditions 2.

8) Further, SOI substrates provided beforehand were dipped into an HF solution, then cleaned with water and dried, and measured for the film thickness of the SOI layer with an optical interference type film thickness meter and subjected to treatments 5) and 6) above and taken out from the load-lock chamber. The thicknesses of the SOI layers were measured again to find that the film thickness reduced only by less than 1 nm in the both samples. That is, they satisfied the conditions 1.

9) The wafers subjected to treatment 4) above were transported to the process chamber of the epitaxial growth apparatus in the manner as mentioned in 5) above.

10) After the pressure of the process chamber was set at 80 Torr, the wafer transported on the susceptor was heated with an IR lamp at a rate of 100° C./min and subjected to heat treatment (pre-bake treatment) to be held at 900° C. for 2 seconds; then $SiH_4$ was added to the hydrogen carrier gas so as to provide a concentration of 35 ppm to thereby treat the wafer for 150 seconds and the addition of $SiH_4$ was stopped. Then, $SiH_2Cl_2$ was added so as to provide a concentration of 1 mol % to thereby form a non-porous monocrystalline silicon film in the thickness of 2 $\mu$m. Then, the temperature was decreased to 750° C. in the hydrogen atmosphere and the wafer was again taken out with the transport robot via the transport chamber to the load-lock chamber. The other wafer was subjected to the pre-bake treatment for 60 seconds and otherwise underwent the same treatment as described above and returned to the load-lock chamber. Note here that when the $SiH_4$ was added to provide the concentration of 35 ppm, the growth rate was 4.3 nm/min.

11) The wafers as finished of treatment 10) above were etched for defect revealing to reveal crystal defects introduced into the non-porous monocrystalline silicon layer and then observed with a Nomarski differential interference microscope. Thus observed defects had a stacking fault percentage of 99% or more. The stacking fault density was $350/cm^2$ for the 5 seconds pre-bake and $630/cm^2$ for the 60 seconds pre-bake, thus being reduced drastically as compared to $1.5 \times 10^4/cm^2$ for the 120-second pre-bake treatment at 1100° C., so that a defect density less than $1000/cm^2$ was attained.

EXAMPLE 6

950° C., 80 Torr, Pre-Bake (2 Seconds), Pre-Injection, Epi-0.32 $\mu$m, Recycle-ELTRAN 1) CZ8-inch (100) p+ silicon wafers were provided which was obtained by adding boron as a p-type impurity to provide a resistivity of 0.015 $\Omega$cm+/−0.01 $\Omega$cm.

2) A surface layer of the first monocrystalline silicon substrate was anodized in an HF solution. The first anodizing conditions were as follows:

Current density: 7 mA/cm$^2$

Anodizing solution: $HF:H_2O:C_2H_5OH=1:1:1$

Time: t (min)

Thickness of porous silicon layer: x($\mu$m)

The other conditions were as follows:

Current density: 50 mA/cm$^2$

Anodizing solution: $HF:H_2O:C_2H_5OH=1:1:1$

Time: 10 (seconds)

Thickness of porous silicon: ~0.2 $\mu$m

The first anodizing time t was changed to 5 minutes and the first low-porosity porous layer thickness x, to 5 $\mu$m.

With this anodizing, the porosity of the porous silicon layer due to a current density of 50 mA/cm$^2$ is increased, thus forming structurally fragile high-porosity thin films.

3) Subsequently, each wafer on which a porous silicon layer was formed was subjected to oxidization in an oxygen atmosphere at 400° C. for 1 hour. Since this oxidization treatment provided only about 50 Å or less thickness of an oxide film, the silicon oxide film was formed only on the porous silicon surface and the pore side walls, leaving a monocrystalline silicon region inside of the wafer.

4) The above-mentioned wafers were dipped for 30 seconds in an HF aqueous solution diluted to 1.25% and then in pure water for 10 minutes for overflow rinsing, to remove the ultra-thin silicon oxide film formed on the porous layer surface.

5) The above-mentioned wafers were placed on a wafer carrier and set in a load-lock chamber of the expitaxial CVD-growth apparatus in which the load-lock chamber to set wafers on the wafer carrier, a transport chamber having a wafer transport robot, and a process chamber were connected. The load-lock chamber was evacuated with a dry pump from the atmospheric pressure down to 1 Torr or less, and $N_2$ gas was introduced thereinto to increase the pressure to 80 Torr. The transport chamber was held at 80 Torr by introducing $N_2$ gas beforehand. In the process chamber was placed a susceptor which is made of carbon coated with CVD-SiC for holding wafers. The susceptor was heated with an IR lamp to about 750° C. beforehand. Into the process chamber was supplied purified hydrogen gas from a hydrogen purifier using a heated palladium alloy via an about 10-meter long internally polished stainless steel pipe.

The wafers were carried with the transport robot from the load-lock chamber via the transport chamber to the process chamber and placed onto the susceptor.

6) The wafers thus transported on the susceptor were heated with an IR lamp at a rate of 100° C./min and held at 950° C. for pre-bake for 2 seconds; then $SiH_4$ was added to the hydrogen carrier gas so as to provide a concentration of 28 ppm to thereby treat the wafer for 200 seconds and the addition of $SiH_4$ was stopped. Then the temperature was lowered to 900° C., and $SiH_2Cl_2$ was added so as to provide a concentration of 0.5 mol % to thereby form a non-porous monocrystalline silicon film in the thickness of 0.32 $\mu$m. Then the temperature was lowered to 750° C. in the hydrogen atmosphere and the wafers were taken out again with the transport robot via the transport chamber to the load-lock chamber. The thus formed non-porous monocrystalline silicon layers have an average thickness of 0.32 $\mu$m and the maximum value–the minimum value=8 nm. After the above-mentioned 2 seconds heat treatment at 950° C., the surface pore density was 7.5×

$10^{10}$ (before the heat treatment: $9.5\times10^{10}$)/cm$^2$, which satisfied the conditions 2 as defined in the present invention.

7) Each wafer on which the non-porous monocrystalline silicon layer was expitaxial-grown was set in a vertical type furnace and subjected to heat treatment at 1000° C. in a mixture gas of water vapor formed by burning oxygen and hydrogen and the remaining oxygen to oxidize the surface of the non-porous monocrystalline silicon to thus form a silicon oxide film with a thickness of 208 nm.

8) Each of the above-mentioned wafer and a second silicon wafer were cleaned in the cleaning line of a silicon semiconductor process and then superposed upon each other gently with their primary main surfaces facing each other and pressed at the middle thereof to integrate them.

9) Subsequently, the thus integrated wafers were set in the vertical type furnace and subjected to heat treatment at 1100° C. in an oxygen atmosphere for 1 hour.

10) The thus bonded wafers were sprayed with a water jet on the side surface thereof to be divided at the high-porosity porous layer. The dividing method includes, besides water jetting, pressure application, pulling force application, shearing force application, wedging and other external pressure application methods, application of ultrasonic waves, heating, oxidizing to expand porous silicon from the periphery to apply an internal pressure therein, heating in a pulse fashion to apply a thermal stress, and softening. Any of these methods enabled the division.

11) The thus exposed porous silicon layers were dipped into a mixture solution of HF and aqueous hydrogen peroxide solution to remove all of the porous silicon in about 2 hours, showing on the whole wafer surface the interference color due to the non-porous monocrystalline silicon layer and the thermally oxidized silicon film.

12) The wafers as finished of treatment 11) above were cleaned in a cleaning line generally used in the silicon semiconductor device process and set in a vertical type hydrogen annealing furnace and subjected to heat treatment in a 100%-hydrogen atmosphere at 1100° C. for 4 hours. The hydrogen gas used was purified by a commercially available hydrogen purifier using a palladium alloy connected to the apparatus via an about 7-meter long stainless steel pipe polished internally.

13) Thus, SOI structure wafers were produced in which a 200 nm thick silicon oxide layer and a 200 nm thick monocrystalline silicon layer were stacked on the second silicon wafer.

The monocrystalline silicon layers had an average thickness of 201 nm and the maximum value−minimum value=8 nm.

14) The wafers as finished of treatment 13) above were subjected to defect revealing etching to remove the monocrystalline silicon layer by the thickness of 130 nm and then dipped into a 49% HF solution for 3 minutes. As a result, the buried oxide film was etched by the HF through the portions of crystal defects remaining in the monocrystalline silicon layer etched by the defect revealing etching, which could be easily determined for the defect density with a Nomarski differential interference microscope. The thus observed defect density was 64/cm$^2$. The stacking faults introduced into the non-porous monocrystalline silicon layer was found to be reduced by the hydrogen annealing. Thus, thin film SOI layers with a uniform film thickness and a defect density less than 100/cm$^2$ were obtained.

Incidentally, SOI substrates provided beforehand were dipped into an HF solution, then cleaned with water and dried, and measured for the film thickness of the SOI layer with an optical interference type film thickness meter and subjected to treatment 5) and only the pre-bake treatment referred to in treatment 6) above and taken out from the load-lock chamber. The thicknesses of the SOI layers were measured again to find that the film thickness reduced only by less than 1 nm in the both samples. That is, they satisfied the conditions 1.

EXAMPLE 7

950° C., 80 Torr, Pre-Bake (2 Seconds), Pre-Injection, Epi-0.32 μm, Hetero-epitaxy Four p-type or n-type 6-inch-diameter (100) monocrystalline silicon substrates with a thickness of 615 μm and a resistivity of 0.01 Ωcm were anodized in an HF solution diluted with alcohol, thus forming a porous silicon layer on one main surface as a mirror surface of each of the substrates.

The anodizing conditions were as follows:
Current density: 7 mA/cm$^2$
Anodizing solution: HF:H$_2$O:C$_2$H$_5$OH=1:1:1
Time: 12 minutes
Thickness of porous silicon layer: 10 μm
Porosity: 20%

3) Subsequently, each wafer on which a porous silicon layer was formed was subjected to oxidization in an oxygen atmosphere at 400° C. for 1 hour. Since this oxidization treatment provided only about 50 Å or less thickness of an oxide film, the silicon oxide film was formed only on the porous silicon surface and the pore side walls, leaving a monocrystalline silicon region inside of the wafer.

4) The above-mentioned wafers were dipped for 30 seconds in an HF aqueous solution diluted to 1.25% and then in pure water for 10 minutes for overflow rinsing, to remove the ultra-thin silicon oxide film formed on the porous layer surface.

5) The above-mentioned wafers were placed on a wafer carrier and set in a load-lock chamber of the epitaxial CVD-growth apparatus in which the load-lock chamber to set wafers on the wafer carrier, a transport chamber having a wafer transport robot, and a process chamber were connected. The load-lock chamber was evacuated with a dry pump from the atmospheric pressure down to 1 Torr or less, and N$_2$ gas was introduced thereinto to increase the pressure to 80 Torr. The transport chamber was held at 80 Torr by introducing N$_2$ gas beforehand. In the process chamber was placed a susceptor which is made of carbon coated with CVD-SiC for holding wafers. The susceptor was heated with an IR lamp to about 750° C. beforehand. Into the process chamber was supplied purified hydrogen gas from a hydrogen purifier using a heated palladium alloy via an about 10-meter long internally polished stainless steel pipe.

The wafers were carried with the transport robot from the load-lock chamber via the transport chamber to the process chamber and placed onto the susceptor.

6) The wafers thus transported on the susceptor were heated with an IR lamp at a rate of 100° C./min and held at 950° C. for pre-bake for 2 seconds; then SiH$_4$ was added to the hydrogen carrier gas so as to provide a concentration of 28 ppm to thereby treat the wafer for 200 seconds and the addition of SiH$_4$ was stopped. Then the temperature was lowered to 750° C. in the hydrogen atmosphere and the wafers were taken out again with the transport robot via the transport chamber to the load-lock chamber. The thus formed non-porous monocrystalline silicon layers have an average thickness of 0.03 μm. After the heat treatment, the surface pore density was $5.9 \times 10^{10}$ (before the heat treatment: $8.9 \times 10^{10}$)/cm$^2$, which satisfied the conditions 2 as defined in the present invention.

By the MOCVD (Metal Organic Chemical Vapor Deposition) method, monocrystalline GaAs was epitaxially grown in the thickness of 1 μm on this porous silicon. The growth conditions were as follows:

Source gas: TMG/AsH$_3$/H$_2$
Gas pressure: 80 Torr
Temperature: 700° C.

As a result of cross-sectional observation by use of a transmission type electron microscope, it was confirmed that no crystal defect was introduced into the GaAs layer and a GaAs layer with good crystallinity was formed. At the same time, it was also confirmed that an extremely abrupt interface was formed between the GaAs layer and the porous silicon layer sealed with silicon on its surface.

Further, defect revealing etching was performed and the thus revealed crystal defects were counted by use of an optical microscope to determined the crystal defect density, which was about $1 \times 10^4$/cm$^2$.

Incidentally, SOI substrates provided beforehand were dipped into an HF solution, then cleaned with water and dried, and measured for the film thickness of the SOI layer with an optical interference type film thickness meter and subjected to treatment 5) and only the pre-bake treatment referred to in treatment 6) above and taken out from the load-lock chamber. The thicknesses of the SOI layers were measured again to find that the film thickness reduced only by less than 1 nm in the both samples. That is, they satisfied the conditions 1.

EXAMPLE 8

Figure 11:
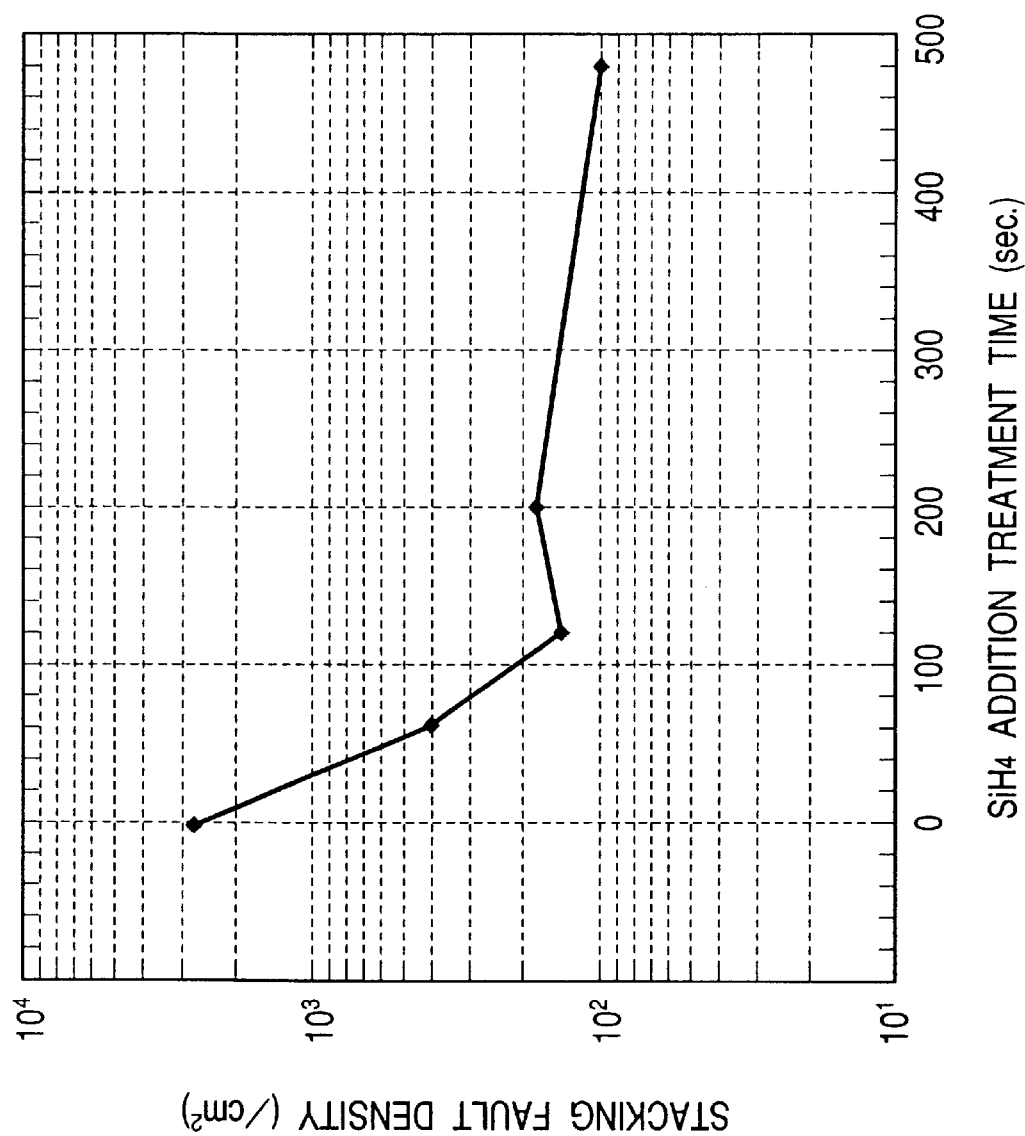
FIG. 11 is a graph explaining a relationship between treatment time for adding a slight amount of $SiH_4$ and stacking fault density.

As disclosed in Japanese Patent Application Laid-Open No. 9-100197, the effect of decreasing crystal defects according to the present invention can be further improved by supplying a slight amount of silicon atoms or a silicon source gas at the initial stage of the growth of the epitaxial layer. Substrates each having a porous layer formed thereon were placed on a susceptor made of carbon coated with CVD-SiC as held at 750° C. in an atmosphere of hydrogen supplied at 43 L/min at a pressure of 600 Torr via a load-lock chamber and heated at a rate of about 100° C./min up to 950° C. and held as such for 2 seconds, after which a slight amount of SiH$_4$ to provide a concentration of about 28 ppm was added for a certain lapse of time, after which the flow rate of the silicon source gas was increased to form a non-porous monocrystalline silicon film of a desired thickness. FIG. 11 shows the dependency of the stacking fault density on the treatment time for adding a slight amount of SiH$_4$. By adding a slight amount of SiH$_4$, the crystal defect density can evidently reduced.

The porous silicon was produced by anodization in a mixed solution of HF, C$_2$H$_5$OH and H$_2$O and the substrates were then heat-treated in a 400° C. oxygen atmosphere for 1 hour. Then, the substrates were dipped in a 1.25% HF aqueous solution for about 25 seconds and cleaned with water and dried and then put in an epitaxial growth apparatus.

The supply of a slight amount of film constituent atoms or a source gas has also such an effect as to promote the removal of an oxide, thus suppressing the generation of defects due to the oxide.

EXAMPLE 9

In a reaction vessel of a load-lock type CVD epitaxial growth apparatus, a susceptor made of carbon coated with CVD-SiC was heated to 750° C. beforehand, and silicon wafers each having a porous silicon layer formed thereon were placed in the vessel via the load-lock chamber. Then, the temperature was raised at a rate of 100° C./min up to 1100° C. under the conditions of 600 Torr and hydrogen supply at 43 L/min and held at 1100° C. for 2 seconds and then lowered to 750° C. at a rate of 100° C./min. Then, the substrates were taken out via the load-lock chamber. The density of surface pores for an average diameter of about 10 nm was reduced from $10^{11}$/cm$^2$ before the heat treatment to $10^6$/cm$^2$, and the pore diameters were increased to 20–40 nm. Under these conditions, subsequently to the above-mentioned heat treatment, a silicon source gas was added to the hydrogen gas to effect epitaxial growth of a monocrystalline silicon layer, thus giving a stacking fault density of $10^4$/cm$^2$. On the other hand, in the case where the wafers were heat-treated at 950° C. instead of 1100° C. above with for the same time of 2 seconds, the decrease of the pore density after the heat treatment was of the order of one digit at most. Also, the pore diameter did not almost decrease. After this heat treatment, a silicon gas was added to the hydrogen gas to effect epitaxial growth of a monocrystalline silicon layer, with the result that the stacking fault density drastically decreased to $10^2$/cm$^2$, 1/100 of the value for the case of 1100° C. heat treatment.

EXAMPLE 10

Next, the present inventor checked the influence of the pre-bake pressure on the stacking fault density.

Figure 12:
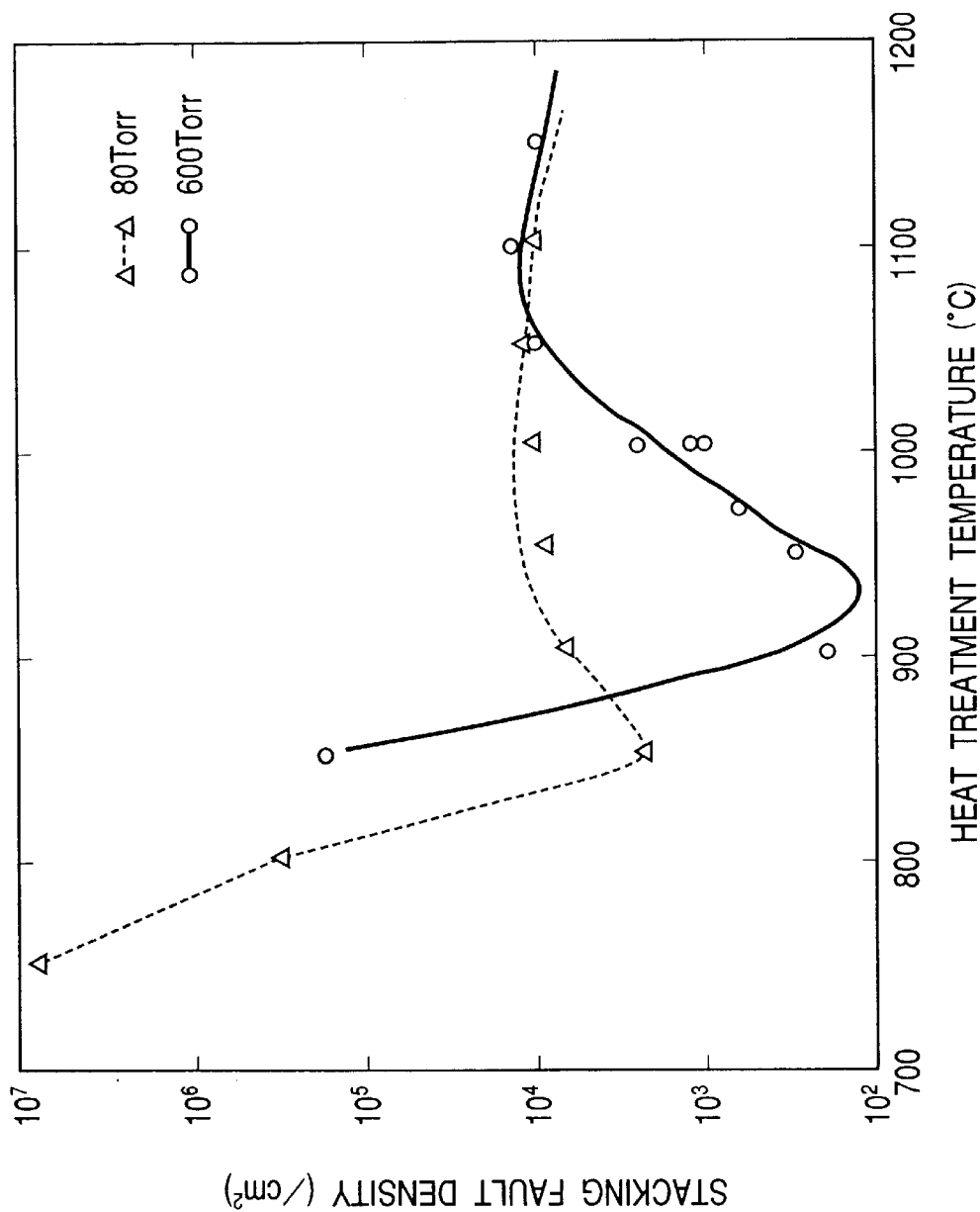
FIG. 12 is a graph explaining a relationship between heat treatment temperature and stacking fault density.

As a result, it is found that the pressure has a serious influence on the surface diffusion of silicon atoms and the pore structure change in the porous silicon layer surface in such a way that the lower the pressure, the lower the temperature at which the minimal value of the stacking fault density appears (FIG. 12).

As samples, were used (100) silicon substrates doped with boron to have a resistivity of 0.013–0.017 Ωcm. Each substrate was anodized in a solution of 49% HF and ethanol mixed at a ratio of 1:1 at a current density of 8 mA/cm$^2$ for 11 minutes to form a porous layer. The porosity was about 20%. The substrate was then dipped in a 1.25% HF solution for 25 seconds and cleaned with water and dried. Then, it was heat-treated at 400° C. in an oxygen atmosphere for 1 hour and dipped in a 1.25% HF solution for such a time as to etch, for example, a silicon oxide film by about 5 nm and then cleaned with water and dried.

Epitaxial growth was effected in a reaction vessel equipped with a load-lock chamber, which means heat treatment in system A as mentioned above. Heat treatment was performed at 80 Torr and at 600 Torr in a hydrogen atmosphere for 120 seconds. Then, SiH$_4$ was added to the hydrogen carrier gas so as to provide a concentration of 28 ppm and treatment was carried out for 120 seconds. Then, the addition of SiH$_4$ was stopped and the pressure was reduced to 80 Torr with the temperature lowered to 900° C., thus forming an epitaxial layer of 2 μm in thickness. Then, the stacking fault density was determined for each heat treatment temperature.

EXAMPLE 11

Figure 13:
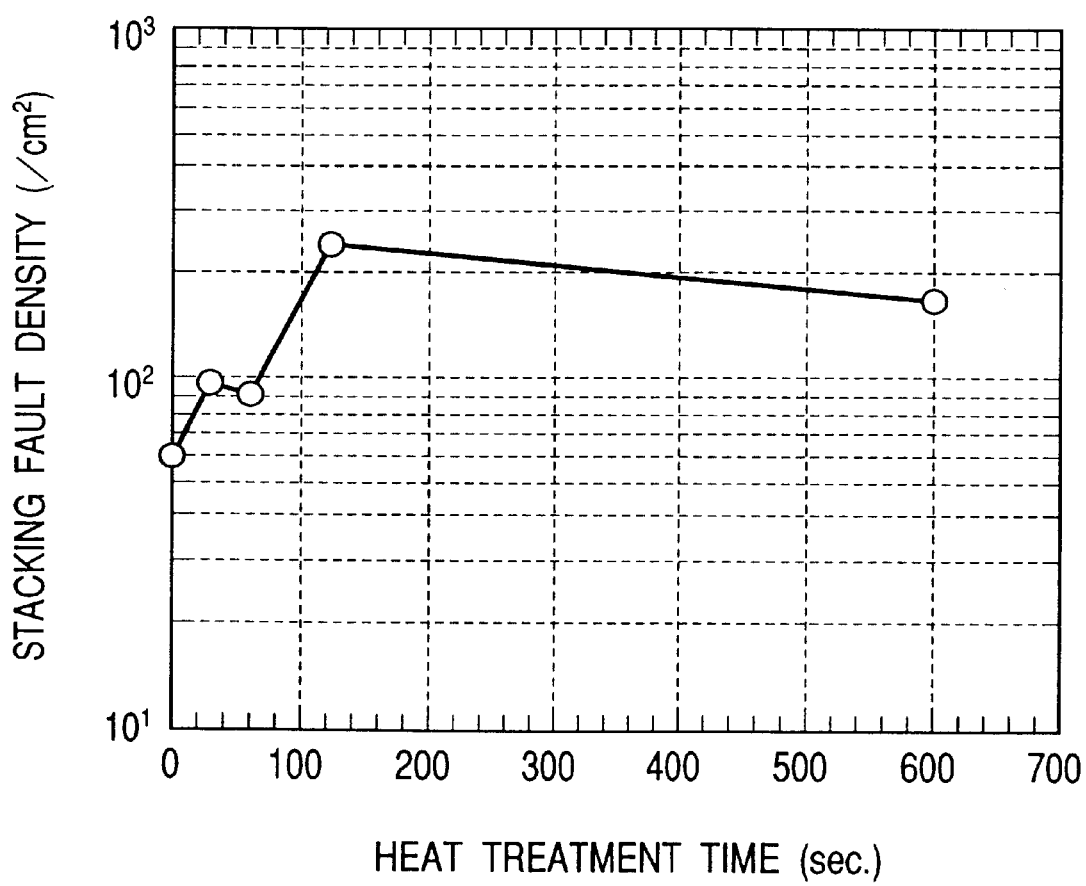
FIG. 13 is a graph explaining a relationship between heat treatment time and stacking fault density.

FIG. 13 shows the dependency of the stacking fault density on the pre-growth heat treatment time for heat treatment in a hydrogen atmosphere at a pressure of 600 Torr at a temperature of 950° C. of samples produced by the same procedure as Example 10. The stacking fault density increased by 2-fold, from that for up to 60 seconds to that for over 120 seconds.

As described above, according to the present invention, by carrying out heat treatment under such conditions that the etched thickness of the monocrystalline silicon is very small and that the pore density of the porous silicon surface is decreased by at most 4 digits, preferably by at most 2 digits, it was possible to decrease the stacking fault density of a non-porous monocrystalline layer formed on a porous layer to less than $1000/cm^2$, even to about $100/cm^2$.

As a result, when the present invention is applied to the bonding method, it is possible to obtain an SOI layer with a uniform film thickness and extremely small number of crystal defects.

In other words, the present invention suppresses the amount of a native oxide film which will be formed on a porous surface in an epitaxial growth apparatus to thus inhibit the enlargement of the pore diameter and also decrease the heat treatment time and temperature for removal of the native oxide film, so that the formation of a non-porous monocrystalline film may be started substantially before sealing of surface pores by diffusion of atoms in the porous surface, thus obtaining an epitaxial layer on porous silicon having a stacking fault density of less than $1000/cm^2$.

What is claimed is:

1. A method of producing a semiconductor substrate comprising:
    a step of providing a substrate comprising a porous silicon layer;
    a heat treatment step of heat-treating the porous silicon layer; and
    a growth step of growing a non-porous monocrystalline layer on the porous silicon layer at a growth rate of 20 nm/min or less,
    wherein the heat treatment step comprises the steps of increasing temperature and removing a native oxide film, wherein the temperature increasing step is conducted at a temperature raising rate of 1° C./sec or more, and wherein the native oxide film removal step is conducted in an atmosphere not containing a source gas of the non-porous monocrystalline layer such that an etched thickness of silicon due to the heat treatment is not more than 2 nm and that a rate of change r for the surface pore density of the porous silicon layer defined by (the surface pore density after the heat treatment)/(the surface pore density before the heat treatment) satisfies the relationship of $(1/10000) \leq r < 1$, and
    wherein in the growth step, the non-porous monocrystalline layer is grown on the porous silicon layer having said relationship of $(1/10000) \leq r < 1$.

2. A method of producing a semiconductor substrate comprising:
    a step of providing a first substrate comprising a porous silicon layer;
    a heat treatment step of heat-treating the porous silicon layer;
    a growth step of growing a non-porous monocrystalline layer on the porous silicon layer at a growth rate of 20 nm/min or less; and
    a step of transferring the non-porous monocrystalline layer grown on the first substrate onto a second substrate,
    wherein the heat treatment step comprises the steps of increasing temperature and removing a native oxide film, wherein the temperature increasing step is conducted at a temperature raising rate of 1° C./sec or more, and wherein the native oxide film removal step is conducted in an atmosphere not containing a source gas of the non-porous monocrystalline layer such that an etched thickness of silicon due to the heat treatment is not more than 2 nm and that a rate of change r for the surface pore density of the porous silicon layer defined by (the surface pore density after the heat treatment)/(the surface pore density before the heat treatment) satisfies the relationship of $(1/10000) \leq r < 1$, and
    wherein in the growth step, the non-porous monocrystalline layer is grown on the porous silicon layer having said relationship of $(1/10000) \leq r < 1$.

3. A method of producing a semiconductor substrate comprising:
    a step of providing a substrate comprising a porous silicon layer;
    a heat treatment step of heat-treating the porous silicon layer; and
    a growth step of growing a non-porous monocrystalline layer on the porous silicon layer at a growth rate of 20 nm/min or less,
    wherein the heat treatment step comprises the steps of increasing temperature and removing a native oxide film, wherein the temperature increasing step is conducted at a temperature raising rate of 1° C./sec or more, and wherein the native oxide film removal step is conducted in an atmosphere not containing a source gas of the non-porous monocrystalline layer such that a rate of change r for the surface pore density of the porous silicon layer defined by (the surface pore density after the heat treatment)/(the surface pore density before the heat treatment) satisfies the relationship of $(1/10000) \leq r < 1$, and
    wherein in the growth step, the non-porous monocrystalline layer is grown on the porous silicon layer having said relationship of $(1/10000) \leq r < 1$.

4. A method of producing a semiconductor substrate comprising:
    a step of providing a first substrate comprising a porous silicon layer;
    a heat treatment step of heat-treating the porous silicon layer;
    a growth step of growing a non-porous monocrystalline layer on the porous silicon layer at a growth rate of 20 nm/min or less; and
    a step of transferring the non-porous monocrystalline layer grown on the first substrate onto a second substrate,
    wherein the heat treatment step comprises the steps of increasing temperature and removing a native oxide film, wherein the temperature increasing step is conducted at a temperature raising rate of 1° C./sec or more, and wherein the native oxide film removal step is conducted in an atmosphere not containing a source has of the non-porous monocrystalline layer such that a rate of change r for the surface pore density of the porous silicon layer defined by (the surface pore density after the heat treatment)/(the surface pore density before the heat treatment) satisfies the relationship of $(1/10000) \leq r < 1$, and
    wherein in the growth step, the non-porous monocrystalline layer is grown on the porous silicon layer having said relationship of $(1/10000) \leq r < 1$.

5. The method of producing a semiconductor substrate according to claim 1, 2, 3 or 4, wherein the growth of the non-porous monocrystalline layer is carried out at a growth rate of 10 nm/min or less.

6. The method of producing a semiconductor substrate according to claim 1, 2, 3 or 4, wherein the growth of the non-porous monocrystalline layer is carried out at a growth rate of 2 nm/min or less.

7. The method of producing a semiconductor substrate according claim 1, 2, 3 or 4 wherein the rate of change r is $1/100 \leq r < 1$.

8. The method of producing a semiconductor substrate according to claim 1, 2, 3 or 4 wherein the etched thickness is 1 nm or less.

9. The method of producing a semiconductor substrate according to claim 1, 2, 3 or 4 wherein the non-porous monocrystalline layer is a non-porous monocrystalline silicon layer.

10. The method of producing a semiconductor substrate according to claim 1, 2, 3 or 4 wherein the non-porous monocrystalline layer is of SiGe, SiC, or a compound semiconductor.

11. The method of producing a semiconductor substrate according to claim 2 or 4, wherein the step of transferring the non-porous monocrystalline layer onto the second substrate comprises the steps of:

bonding the first substrate and the second substrate to each other such that the non-porous monocrystalline layer is positioned inside; and removing the porous silicon layer.

12. The method of producing a semiconductor substrate according to claim 2 or 4, wherein the step of transferring the non-porous monocrystalline layer onto the second substrate comprises the steps of:

bonding the first substrate and the second substrate to each other such that non-porous monocrystalline layer is positioned inside; and dividing the bonded member at the porous silicon layer.

13. The method of producing a semiconductor substrate according to claim 2 or 4, wherein the step of transferring the non-porous monocrystalline layer onto the second substrate comprises the step of bonding the first substrate and the second substrate to each other with an insulating layer therebetween.

14. The method of producing a semiconductor substrate according to claim 13, wherein the insulating layer is formed on at least one of the non-porous monocrystalline layer and the second substrate.

15. The method of producing a semiconductor substrate according to claim 2 or 4, wherein the second substrate is a monocrystalline silicon substrate.

16. The method of producing a semiconductor substrate according to claim 2 or 4, wherein the second substrate is a quartz wafer.

17. The method of producing a semiconductor substrate according to claim 1, 2, 3 or 4, wherein the native oxide film removal step is conducted at a temperature not lower than 850° C. and not higher than 1000° C.

18. The method of producing a semiconductor substrate according to claim 1, 2, 3 or 4, wherein the native oxide film removal step is conducted in a treatment time of 200 seconds or less.

19. The method of producing a semiconductor substrate according to claim 1, 2, 3 or 4 further comprising, prior to the heat treatment step, the step of forming a protective film on the pore walls of the porous silicon layer.

20. The method of producing a semiconductor substrate according to claim 1, 2, 3 or 4 further comprising, prior to the heat treatment step, the step of removing an oxide film formed on a surface of the porous silicon layer.

21. The method of producing a semiconductor substrate according to claim 1, 2, 3 or 4 wherein the growth step is conducted at a first growth rate and then conducted at a second growth rate larger than the first growth rate.

22. The method of producing a semiconductor substrate according to claim 1, 2, 3 or 4 wherein the heat treatment step and the growth step are conducted in a reaction vessel equipped with a load-lock chamber.

23. The method of producing a semiconductor substrate according to claim 1, 2, 3 or 4 wherein the heat treatment step is conducted at a pressure higher than the pressure at which the growth step is conducted.

24. The method of producing a semiconductor substrate according to claim 1, 2, 3 or 4 wherein the porous silicon layer is obtained by anodizing at least a part of non-porous monocrystalline silicon.

25. The method of producing a semiconductor substrate according to claim 24, where the anodization is carried out using a solution containing hydrofluoric acid, water, and alcohol.

26. The method of producing a semiconductor substrate according to claim 1, 2, 3 or 4 wherein the substrate comprising the porous silicon layer is doped with an impurity at a degenerated level.

27. The method of producing a semiconductor substrate according to claim 1, 2, 3 or 4 wherein the heat treatment step is conducted in a non-oxidizing atmosphere containing hydrogen.

28. The method of producing a semiconductor substrate according to claim 1, 2, 3 or 4 wherein the heat treatment step is conducted in a reducing atmosphere containing hydrogen gas, a nitrogen gas atmosphere, or an inert gas atmosphere.

29. The method of producing a semiconductor substrate according to claim 1, 2, 3 or 4 wherein the heat treatment step is conducted in an ultra-high vacuum.

30. The method of producing a semiconductor substrate according to claim 1, 2, 3 or 4, wherein the native oxide film removal step is conducted at a temperature not lower than 870° C. and not higher than 970° C.

* * * * *

UNITED STATES PATENT AND TRADEMARK OFFICE
CERTIFICATE OF CORRECTION

PATENT NO. : 6,593,211 B2
DATED : July 15, 2003
INVENTOR(S) : Nobuhiko Sato

It is certified that error appears in the above-identified patent and that said Letters Patent is hereby corrected as shown below:

Column 1,
Line 63, "mixture" should read -- liquid --; and
Line 64, "liquid" should read -- mixture --.

Column 2,
Line 19, "mixture liquid" should read -- liquid mixture --.

Column 3,
Line 53, "till" should read -- still --.

Column 5,
Line 44, "one the" should read -- the --; and
Line 46, "one" should be deleted.

Column 7,
Line 2, "35 973 (1996)" should read -- 35 (1996) 973 --.

Column 10,
Line 1, "are" should read -- is --; and
Line 3, "so much oxidized" should read -- oxidize much --.

Column 13,
Line 8, "Lattice" should read -- lattice --.

Column 16,
Line 67, "proceed" should read -- proceeds --.

Column 17,
Line 25, "suppress" should read -- suppresses --.

Column 18,
Line 13, "(epitaxial" should read --epitaxial --; and
Line 65, "be" should be deleted.

Column 19,
Line 57, "CVD-SIC" should read -- CVD-SiC --; and
Line 67, "was heated" should read -- were heated --.

UNITED STATES PATENT AND TRADEMARK OFFICE
CERTIFICATE OF CORRECTION

PATENT NO. : 6,593,211 B2
DATED : July 15, 2003
INVENTOR(S) : Nobuhiko Sato

It is certified that error appears in the above-identified patent and that said Letters Patent is hereby corrected as shown below:

Column 20,
Line 7, "Load-lock" should read -- load-lock --; and
Line 23, "the both" should read -- both --.

Column 21,
Line 43, "stainles" should read -- stainless --.

Column 22,
Line 57, "pre-Injection" should read -- Pre-Injection --.

Column 23,
Line 43, "was heated", should read -- were heated --.

Column 24,
Line 2, "the both" should read -- both --.

Column 25,
Line 22, "was heated" should read -- were heated --;
Line 23, "to 100° C." should read -- to 900° C. --; and
Line 48, "the both" should read -- both --.

Column 26,
Line 18, "80 Torr." should read -- 80 Torr, --.

Column 27,
Line 5, "was heated" should read -- were heated --;
Line 27, "the both" should read -- both --.

Column 28,
Line 7, "layer:x($\mu$m)" should read -- layer: x($\mu$m) --.

Column 30,
Line 7, "the both" should read -- both --.

UNITED STATES PATENT AND TRADEMARK OFFICE
CERTIFICATE OF CORRECTION

PATENT NO. : 6,593,211 B2
DATED : July 15, 2003
INVENTOR(S) : Nobuhiko Sato

It is certified that error appears in the above-identified patent and that said Letters Patent is hereby corrected as shown below:

<u>Column 31,</u>
Line 21, "determined" should read -- determine --;
Line 31, "the both" should read -- both --; and
Line 52, "reduced" should read -- be reduced --.

Signed and Sealed this

Sixth Day of July, 2004

JON W. DUDAS
*Acting Director of the United States Patent and Trademark Office*